US006800166B2

(12) United States Patent
Kosaka et al.

(10) Patent No.: US 6,800,166 B2
(45) Date of Patent: Oct. 5, 2004

(54) TRANSFER SHEET

(75) Inventors: Yozo Kosaka, Tokyo (JP); Katsuhiko Mizuno, Tokyo (JP); Sakurako Hatori, Tokyo (JP); Kounosuke Tanaka, Tokyo (JP); Nobuaki Kimura, Tokyo (JP); Toshihiko Takeda, Tokyo (JP)

(73) Assignee: Dal Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/231,923

(22) Filed: Aug. 29, 2002

(65) Prior Publication Data

US 2003/0108727 A1 Jun. 12, 2003

Related U.S. Application Data

(62) Division of application No. 09/165,266, filed on Oct. 1, 1998, now abandoned.

(30) Foreign Application Priority Data

| Oct. 3, 1997 | (JP) | 9-287992 |
| Oct. 27, 1997 | (JP) | 9-311361 |
| Oct. 27, 1997 | (JP) | 9-311362 |
| Oct. 27, 1997 | (JP) | 9-311363 |
| Nov. 14, 1997 | (JP) | 9-331263 |
| Mar. 13, 1998 | (JP) | 10-08035 |

(51) Int. Cl.$^7$ ............... B44C 1/165; B32B 31/26; B05D 5/12; G05C 1/76; H01L 21/44

(52) U.S. Cl. ............ 156/230; 156/247; 156/272.2; 156/289; 427/96; 427/147; 427/148; 428/195.1; 428/202; 428/914; 430/198; 430/271.4; 430/325

(58) Field of Search ................ 156/230, 240, 156/247, 275.5, 289, 241, 272.2; 427/146, 147, 148, 151, 96, 126.6; 428/40.1, 41.7, 41.8, 195.1, 202, 343, 349, 904, 195, 114; 430/198, 271.1, 256, 319, 325

(56) References Cited

U.S. PATENT DOCUMENTS

| 5,858,918 A | 1/1999 | Shirai et al. ............ 503/227 |
| 5,909,083 A | 6/1999 | Asano et al. ............ 313/584 |
| 5,992,320 A | 11/1999 | Kosaka et al. .......... 101/401.1 |
| 6,008,562 A | 12/1999 | El-Antably et al. ........ 313/582 |
| 6,156,433 A | * 12/2000 | Hatori et al. ............ 428/914 |

FOREIGN PATENT DOCUMENTS

| JP | 09-055167 | * 2/1997 | ............ H01J/17/04 |
| JP | 10-040821 | * 2/1998 | ............ H01J/11/00 |
| JP | 10-116558 | * 5/1998 | ............ H01J/9/02 |

* cited by examiner

Primary Examiner—J A Lorengo
(74) Attorney, Agent, or Firm—Dellett & Walters

(57) ABSTRACT

The invention relates to a transfer sheet suitable for the formation of electrode patterns, dielectric layers, barrier layers, etc. in plasma display panels (PDPs), field emission displays (FEDS), liquid crystal displays (LCDs), fluorescent displays, hybrid integrated circuits, etc. The transfer sheet comprises a base film and a transfer layer releasably provided on the base film, optionally with a protective film provided on the transfer layer. The transfer layer comprises an inorganic component including a glass frit and an organic component removable by firing, optionally with an electrically conductive powder. By specifying the surface roughness and surface gloss of the transfer layer, the releasability of the transfer layer with respect to the base or protective film, and the residual solvent content of the transfer layer, it is possible to form, with high accuracy, primer layers, dielectric layers on front or back panel plates, photosensitive black matrix layers, and photosensitive rib layers for use with PDPS, and form high-definition electrode patterns as well.

6 Claims, 6 Drawing Sheets

(A)

(B)

(C)

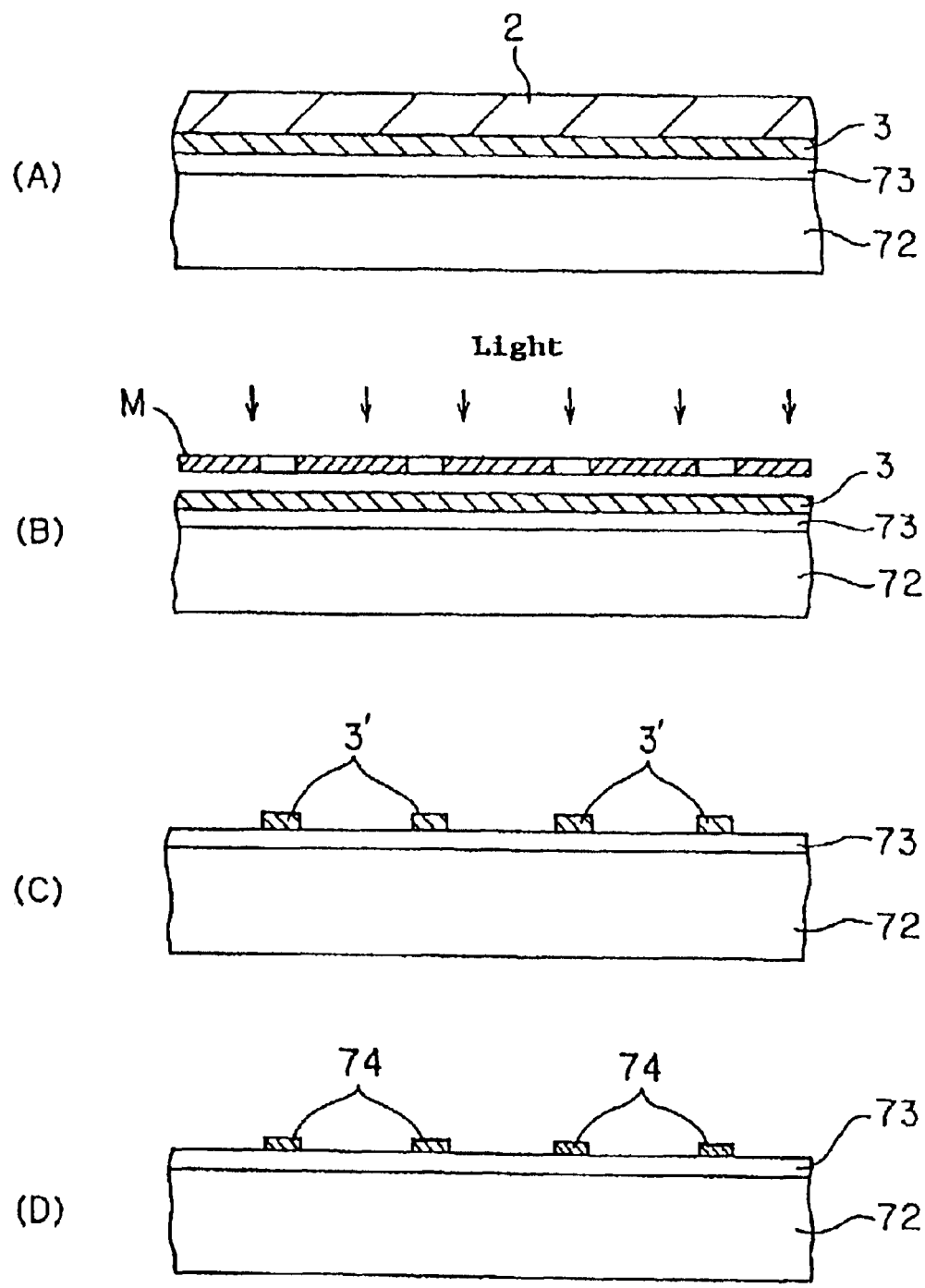

TRANSFER SHEET

This application is a divisional of Ser. No. 09/165,266 filed Oct. 1, 1998 now abandoned.

BACKGROUND OF THE INVENTION

The present invention relates to a transfer sheet suitable for the formation, with high precision and ease, of electrode patterns, dielectric layers, barrier layers, etc. for use with plasma display panels (PDPs), field emission displays (FEDs), liquid crystal displays (LCDs), fluorescent displays, hybrid integrated circuits, etc.

For fine patterns such as electrodes, dielectric layers, barrier layers, etc. for use with PDPs, it is now required that they be fabricated at low fabrication costs while thickness accuracy and pattern accuracy are maintained at high levels.

So far, patterns for use with PDPs have been provided by forming a patterning paste having desired properties into a given pattern by a printing process such as screen or offset printing, followed by drying, and firing. This printing process involves simple steps, and so is expected to lead to production cost reductions. However, problems with the screen printing process are that the elongation of a mesh material forming a screen printing plate places some limitation on printing accuracy, and that the edge accuracy of the resultant pattern becomes low due to the occurrence of meshes in the pattern or the spreading of the pattern. A problem with the offset printing process is, on the other hand, that thickness accuracy and pattern accuracy decrease with increasing printing cycles because some patterning paste is not perfectly transferred to a substrate and so remains on a blanket. It is consequently required to make frequent blanket replacements, thereby preventing the paste from remaining on the blanket and maintaining the accuracy of the pattern upon forming. The operation to this end is, however, very troublesome.

A given thick-film pattern having a high aspect ratio, e.g., a PDP barrier pattern, has so far been formed by a screen printing process. With the screen printing process, the limitation of film thickness formed in one single cycle is of the order of a few tens $\mu$m. In other words, printing and drying cycles should be repeated many times, generally 10 or more times. A coating film formed by the screen printing process is generally of a convex shape in section or is bulging out. Consequently, when a multiplicity of printing cycles are carried out as mentioned above, coating solution sags are built up at the periphery of the pattern, and so make the pattern have a spreading bottom.

It has recently been proposed to form a barrier layer using a transfer sheet comprising a glass paste provided on a base film (JP-A 8-273536). This process makes use of the transfer sheet having a glass paste layer, and is advantageous in that the process of fabricating barriers for PDP panels can be simplified. However, problems arise in connection with the trapping of air bubbles by transfer, and the releasability of the glass paste layer from the base film. Especially when a fine electrode pattern or dielectric layer is formed by use of the transfer sheet, air bubbles, etc. are likely to pass into the transfer layer. Also, poor transfer causes breaks in the electrode pattern or pinholes in the dielectric layer.

In view of such problems as mentioned above, one object of the invention is to provide a transfer sheet which can be used to form, with great accuracy, fine patterns such as electrodes, resistors, e.g., dielectric layers, barriers, etc. for use image displays such as PDPs and LCDs, thermal heads, integrated circuits, etc.

Another object of the invention is to provide a transfer sheet which can be used to form, with great accuracy, primer layers, dielectric layers on front and back panels, photosensitive black matrix layers, and photosensitive rib layers for use with PDPs in particular.

Yet another object of the invention is to provide a transfer sheet which makes it possible to form a high-definition electrode pattern.

SUMMARY OF THE INVENTION

According to the first aspect of the invention, there is provided a transfer sheet comprising, at least, a base film and a transfer layer releasably provided on the base film, characterized in that the transfer layer comprises, at least, an inorganic component including a glass frit and an organic component removable by firing, and has a surface roughness Ra of at most 0.4 $\mu$m.

Preferably, the transfer layer is characterized by having a releasable protective film thereon, and in that the surface roughness Ra of the transfer layer upon the protective film released therefrom is at most 0.2 $\mu$m.

Preferably, the organic component is characterized by being sensitive to light.

Preferably, the transfer layer contains a conductive powder as the inorganic component.

The first transfer sheet of the invention comprises, at least, a base film and a transfer layer releasably provided on the base film, which transfer layer comprises, at least, an inorganic component including a glass frit and an organic component removable by firing and has a surface roughness Ra of at most 0.4 $\mu$m (the surface roughness Ra of the transfer layer upon release of a protective film is at most 0.2 $\mu$m). Thus, the transfer layer is improved in terms of surface smoothness; that is, it is substantially free of defects such as agglomerates, pinholes, etc. due to poor dispersion of the inorganic component. When the transfer layer has a protective film thereon, air bubbles are unlikely to be trapped between the transfer layer and the protective film, so that the surface smoothness of the transfer layer can be kept in good condition with an improvement in the transferability of the transfer layer to an associated application member. It is thus possible to form a primer or dielectric layer of uniform thickness. When the organic component is sensitive to light, the accuracy of patterning by exposure and development is so improved that high-definition patterns for electrodes, dielectric layers, etc., and high-definition thick-film patterns for barriers, etc. can be formed.

A second transfer sheet of the invention comprises, at least, a base film and a transfer layer releasably provided on the base film, and is characterized in that the transfer layer comprises, at least, an inorganic component including a glass frit and an organic component removable by firing, and has a surface gloss of 20 to 110.

Preferably, the transfer layer is characterized by having a releasable protective film thereon, and in that the surface gloss of the transfer layer upon release of the protective film therefrom is in a range of 30 to 110.

Preferably, the organic component is characterized by being sensitive to light.

The second transfer sheet of the invention comprises, at last, a base film and a transfer layer releasably provided on the base film, which transfer layer comprises, at least, an inorganic component containing glass frit and an organic component removable by firing, and has a surface gloss of 20 to 110 (the surface gloss of the transfer layer upon release of a protective film therefrom is in a range of 30 to 110). Thus, the transfer layer is improved in terms of surface smoothness; that is, it is substantially free of defects such as agglomerates, pinholes, etc. due to poor dispersion of the inorganic component. When the transfer layer has a protective film thereon, air bubbles are unlikely to be trapped between the transfer layer and the protective film, so that the surface smoothness of the transfer layer can be kept in good condition with an improvement in the transferability of the transfer layer to an associated application member. It is thus possible to form a primer or dielectric layer of uniform thickness. When the organic component is sensitive to light, the accuracy of patterning by exposure and development is so improved that high-definition patterns for electrodes, dielectric layers, etc., and high-definition thick-film patterns for barriers, etc. can be formed.

A third transfer sheet of the invention comprises, at least, a base film and a transfer sheet releasably provided on the base film, and is characterized in that the transfer sheet comprises, at least, an inorganic component including a glass frit and an electrically conductive powder, and an organic component removable by firing, and has a surface gloss of 20 to 110.

Preferably, the transfer layer is characterized by having a releasable protective film thereon, and in that the surface gloss of the transfer layer upon release of the protective film therefrom is in a range of 40 to 110.

Preferably, the organic component is characterized by being sensitive to light.

The third transfer sheet of the invention comprises a base film, and a transfer layer releasably provided on the base film, which transfer layer comprises, at least, an inorganic component including a glass frit and an electrically conductive powder and an organic component removable by firing, and has a surface glossiness of 20 to 110. Thus, the transfer layer is improved in terms of surface smoothness; that is, it is substantially free of defects such as agglomerates, pinholes, etc. due to poor dispersion of the inorganic component. When the transfer layer has a protective film thereon, air bubbles are unlikely to be trapped between the transfer layer and the protective layer, so that the surface smoothness of the transfer layer can be kept in good condition with an improvement in the transferability of the transfer layer to an associated application member. It is thus possible to form a primer or dielectric layer of uniform thickness. When the organic component is sensitive to light, the accuracy of patterning by exposure and development is so improved that high-definition patterns for electrodes, dielectric layers, etc., and high-definition thick-film patterns for barriers, etc. can be formed.

A fourth transfer sheet of the invention comprises, at least, a base film and a transfer layer releasably provided on the base film, and is characterized in that the transfer layer comprises, at least, an inorganic component including a glass frit and an organic component removable by firing, and a peel strength between the base film and the transfer layer is in a range of 2 to 30 g/25 mm.

Preferably, the transfer layer is characterized by having a releasable protective film thereon, and that a peel strength between the protective film and the transfer layer is in a range of 1 to 27 g/25 mm and smaller than the peel strength between the base film and the transfer layer.

Preferably, the organic component is characterized by being sensitive to light.

The fourth transfer sheet, designed for the fabrication of a plasma display panel, comprises a base film and a transfer layer releasably provided on the base film, which transfer layer comprises, at least, an inorganic component including a glass frit and an organic component removable by firing, and has a peel strength in the range of 2 to 30 g/25 mm. Thus, it is possible to transfer, with an improved transferability, the transfer layer to an associated application member because the transfer layer can be released from the base film with no cohesive failure of the transfer layer. When the protective film is provided on the transfer layer while the peel strength between them is in the range of 1 to 27 g/25 mm and smaller than that between the base film and the transfer layer, the protective film can be released from the transfer layer with no cohesive failure of the transfer layer and with no release of the transfer layer from the base film. The release of the transfer layer from the base film, and the release of the protective film from the transfer layer can be mechanically carried out in a stable manner without any large tension variation because the peel strengths are within the aforesaid ranges, so that the transfer layer can be transferred, with great transferability, to the associated application member, thereby forming a dielectric layer of uniform thickness. When the organic component is sensitive to light, the accuracy of patterning by exposure and development is so high that a high-definition dielectric pattern can be formed.

A fifth transfer sheet of the invention comprises a base film and a transfer layer releasably provided on the base film, and is characterized in that the transfer layer comprises, at least, an inorganic component including a glass frit and an electrically conductive powder, and an organic component removable by firing, and a peel strength between the base film and the transfer layer is in a range of 0.2 g/25 mm to 30 g/25 mm inclusive.

Preferably, the transfer film is characterized by having a releasable protective film thereon, and in that a peel strength between the protective film and the transfer layer is in a range of 0.1 g/25 mm to less than 30 g/25 mm and smaller than that between the base film and the transfer layer.

Preferably, the organic component is characterized by being sensitive to light.

The fifth transfer sheet of the invention comprises a base film and a transfer layer releasably provided on the base film, which transfer layer comprises, at least, an inorganic component including a glass frit and an electrically conductive powder, and an organic component removable by firing, and has a peel strength in the range of 0.2 g/25 mm to 30 g/25 mm inclusive. Thus, it is possible to transfer, with an improved transferability, the transfer layer to an associated application member because the transfer layer can be released from the base film with no cohesive failure of the transfer layer. When the protective film is provided on the transfer layer while the peel strength between them is in the range of 0.1 g/25 mm to less than 30 g/25 mm and smaller than that between the base film and the transfer layer, the protective film can be released from the transfer layer with no cohesive failure of the transfer layer and with no release of the transfer layer from the base film. The release of the transfer layer from the base film, and the release of the protective film from the transfer layer can be mechanically carried out in a stable manner without any large tension variation because the peel strengths are within the aforesaid ranges, so that the transfer layer can be transferred, with great transferability, to the associated application member, thereby forming a dielectric layer of uniform thickness. When the organic component is sensitive to light, the accuracy of patterning by exposure and development is so high that a high-definition dielectric pattern can be formed.

A sixth transfer sheet of the invention comprises, at least, a base film and a transfer layer releasably provided on the base film, and is characterized in that the transfer layer comprises, at least, an inorganic component including a glass frit and an organic component removable by firing, and has a residual solvent content of at most 100 mg/m$^2$.

Preferably, the transfer layer is characterized by having a releasable protective film thereon.

Preferably, the organic component is characterized by being sensitive to light.

Preferably, the transfer layer is characterized by containing an electrically conductive power as the inorganic component.

The sixth transfer sheet of the invention comprises a base film and a transfer layer releasably provided on the base film, which transfer layer comprises, at least, an inorganic component including a glass frit and an organic component removable by firing, and has a residual solvent content of at most 100 mg/m$^2$. Thus, the transfer layer is unlikely to break down by cohesion, and improved in terms of storage stability, and transferability with respect to the base film upon transfer. When the protective film is provided on the transfer layer, it can be well released from the transfer layer. When the organic component is sensitive to light, the accuracy of patterning by exposure and development is so high that high-definition patterns for electrodes, dielectric layers, etc., and high-definition thick-film patterns for barriers, etc. can be formed.

BRIEF DESCRIPTION OF THE DRAWINGS

FIG. 7 is a process sequence for illustrating one example of electrode pattern formation using the first, third, fifth, and sixth transfer sheets of the invention.

DESCRIPTION OF THE PREFERRED EMBODIMENTS

Figure 1:
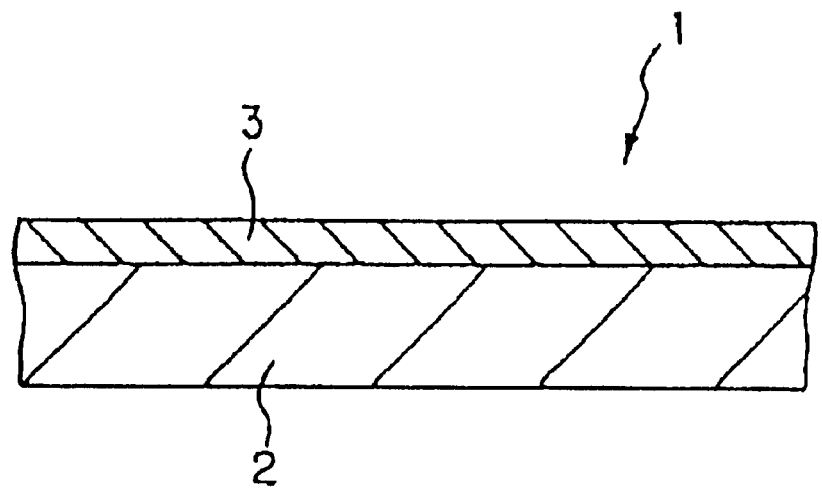
FIG. 1 is a sectional schematic of one embodiment of the first to sixth transfer sheets of the invention.
Figure 2:
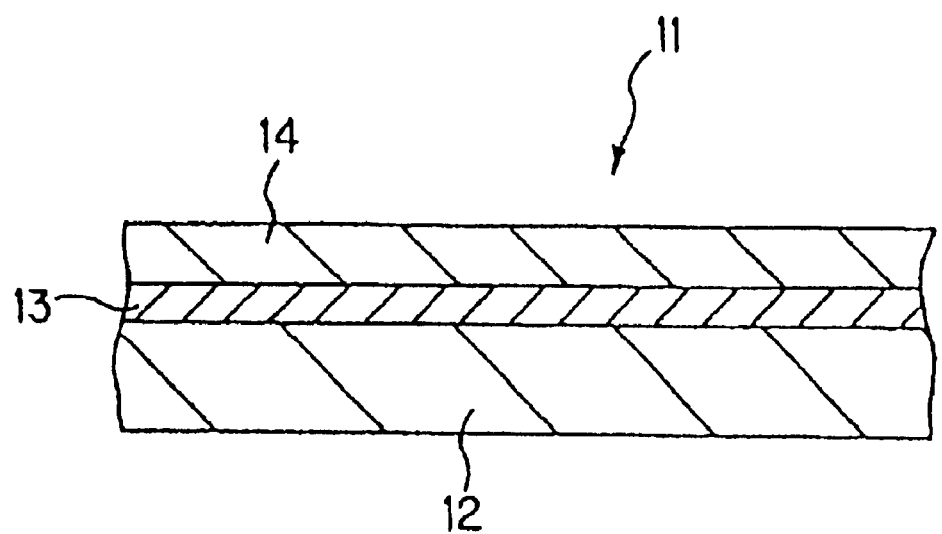
FIG. 2 is a sectional schematic of another embodiment of the first to sixth transfer sheets of the invention.

FIG. 1 is a sectional schematic of one embodiment of the first to sixth transfer sheets of the invention, wherein a transfer sheet 1 comprises a base film 2 and a transfer layer 3. FIG. 2 is a sectional schematic of another embodiment of the first to sixth transfer sheets of the invention, wherein a transfer sheet 11 comprises a base film 12, a transfer layer 13 releasably provided on the base film 12, and a protective film 14 releasably provided on the transfer layer 13.

The transfer sheet 1 or 11 may be in a sheet or continuous form. The continuous form of transfer sheet may be rolled around a core. To prevent dusting or paper dusting in this case, the core may be made up of ABS resin, vinyl chloride resin, Bakelite, etc. Alternatively, a resin-impregnated paper tube or the like may be used to this end.

The first to sixth transfer sheets of the invention may be suitable for the formation, with great precision and ease, of electrode patterns, dielectric layers, barrier layers, etc. in PDPs, FEDs, LCDS, fluorescent displays, hybrid integrated circuits, etc. A typical application of the transfer sheet to an AC type PDP is explained just below.

Figure 3:
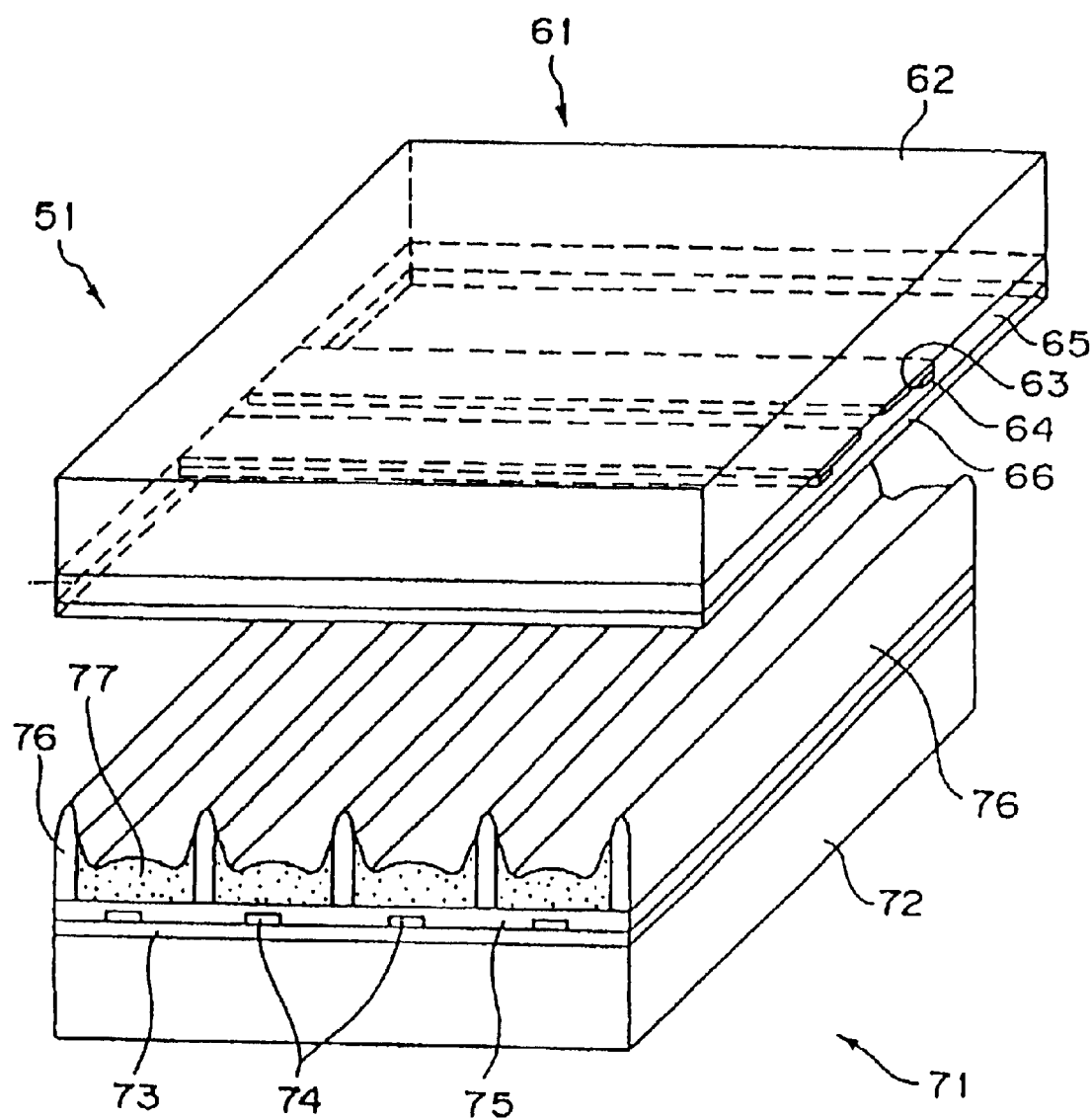
FIG. 3 is a perspective schematic of one example of a plasma display panel.

FIG. 3 is a perspective schematic of an AC type PDP, wherein a front panel plate is spaced away from a back panel plate. As can be seen from FIG. 3, a PDP 51 comprises a front panel plate 61 and a back panel plate 71 which are parallel with, and in opposition to, each other. The back panel plate 71 is vertically provided with barrier walls 76 on its front side, by which the front and back panel plates 61 and 71 are spaced away from each other at a given interval. The front panel plate 61 comprises a front glass substrate 62, which is provided on its back side with a parallel array of composite electrodes consisting of transparent electrodes or sustaining electrodes 63 and metal electrodes or bus electrodes 64. This electrode array is covered with a dielectric layer 65, on which an MgO layer 66 is formed. The back panel plate 71 comprises a back glass substrate 72, which is provided on its front side with a parallel array of address electrodes 74. The address electrode array intersects at right angles with the composite electrode array via a primer layer 73 and is located between the barrier walls 76. The address electrode array is covered with a dielectric layer 75, and a fluorescent layer 77 is provided over the surfaces of the barrier walls 76 and the bottoms of cells. To put the AC type PDP into operation, given voltage is applied from an alternating current power source between the composite electrodes on the front glass substrate 62 to form an electric field, so that discharge can occur in cells defining display elements divided by the front glass substrate 62, back glass substrate 72 and barrier walls 76. Then, this discharge can give out ultraviolet radiation, which in turn allows light to be emitted out of the fluorescent layer 77. The observer can observe this light passing through the front glass substrate 62.

While, in the example illustrated, the address electrodes 74 are formed on the back glass substrate 72 with the primer layer 73 located between them, it is understood that the address electrodes 74 may be provided directly on the back glass substrate 72, i.e., with no provision of the primer layer 73.

The first transfer sheet of the invention is explained. The first transfer sheet can be used for the formation of electrodes, resistors such as dielectric layers, barriers, etc. in image displays such as PDPs and LCDs, thermal heads, integrated circuits, etc.

Referring to FIG. 1, the transfer layer 3 is releasably provided on the base film 2. The transfer layer 3 comprises, at least, an inorganic component including a glass frit and an organic component removable by firing, and has a surface roughness Ra of at most 0.4 μm, and preferably at most 0.2 μm.

Referring then to FIG. 2, the transfer layer 13 comprises, at least, an inorganic component including a glass frit and an organic component removable by firing. The transfer layer 13 has a surface roughness Ra of at most 0.4 μm, and preferably at most 0.2 μm before the protective film 14 is releasably laminated thereon, and a surface roughness Ra of at most 0.2 μm upon release of the protective film 14 therefrom.

The transfer layer in the first transfer sheet 1 or 11 of the invention has a surface roughness Ra of at most 0.4 μm (the surface roughness Ra of the transfer layer upon release of the protective film therefrom is at most 0.2 μm), and so is improved in terms of surface smoothness. In the transfer sheet 11, the trapping of air bubbles between the transfer layer 13 and the protective film 14 is prevented upon lamination of the protective film 14 on the transfer layer 13. Transfer of the transfer layer 3 or 13 (the transfer sheet 11 from which the protective film 14 is removed) to an associated application member is achievable while they are in closer contact with each other, and the trapping of air bubbles between them is prevented, resulting an improved transferability.

The surface roughness Ra of the transfer layer according to the invention is given by a value found by use of Decktack 16000 made by Beeco Co., Ltd., and is an index to the surface smoothness of the transfer layer 3 or 13. In other words, when the transfer layer 3 or 13 has such defects as agglomerates or pinholes ascribable to poor dispersion of the inorganic component, the surface roughness Ra exceeds 0.4 $\mu$m due to a surface smoothness drop.

With the protective film 14 laminated on the transfer layer 13, the surface smoothness of the transfer layer 13 is usually improved. However, when the smoothness of the surface of contact of the protective film 14 with the transfer layer 13 is unsatisfactory, the surface smoothness of the transfer layer 13 upon release of the protective film 14 therefrom becomes worse, with the result that the surface roughness Ra of the transfer layer 13 exceeds 0.2 $\mu$m. This is the reason the surface roughness Ra of the transfer layer 13 is preset at 0.4 $\mu$m or lower and the surface roughness Ra of the transfer layer 13 upon release of the protective film 14 therefrom is preset at 0.2 $\mu$m or lower. It is thus possible to obtain a transfer sheet comprising a transfer layer having improved surface properties.

Thus, the smaller the surface roughness Ra of the transfer layer 3 or 13, the better the surface smoothness of the transfer layer is. However, when the surface roughness Ra is less than 0.01 $\mu$m or when the surface roughness Ra of the transfer layer upon release of the protective film therefrom is less than 0.005 $\mu$m, not only is any additional effect due to the improved surface smoothness expectable, but also the fabrication cost may often increase, resulting in a fabrication yield drop. For this reason, the lower limit to the surface roughness Ra is preferably about 0.01 $\mu$m, and the lower limit to the surface roughness Ra of the transfer layer upon release of the protective film therefrom is preferably about 0.005 $\mu$m.

The surface smoothness of the transfer layer 3 or 13 is affected by the powder shape and content of the inorganic component, the type and content of the organic component, the solvent used, the coating conditions applied, etc., as will be described later. It is thus required to form the transfer layer 3 or 13 under such conditions that the surface roughness Ra comes within the aforesaid range.

The structure of the first transfer sheet 1 or 11 of the invention is now explained.

Base Film

For the base film 2 or 12 forming one part of the transfer sheet 1 or 11 of the invention, it is required to use a material that is stable with respect to an ink composition used for the formation of the transfer layer 3 or 13, and so flexible that it cannot substantially be deformed under the influence of tension or pressure.

For such a material, a resin film is first exemplified. Exemplary resin films are polyethylene films, ethylene-vinyl acetate copolymer films, ethylene-vinyl alcohol copolymer films, polypropylene films, polystyrene films, poly- methacrylic ester films, polyvinyl chloride films, polyvinyl alcohol films, polyvinyl butyral films, nylon films, polyether ketone films, polyphenylene sulfide films, polysulfone films, polyether sulfone films, polytetrafluoroethylene-perfluoroalkylvinyl ether films, polyvinyl fluoride films, tetrafluoroethylene-ethylene films, tetrafluoroethylene-hexafluoropropylene films, polychlorotrifluoroethylene films, polyvinylidene fluoride films, polyethylene terephthalate films, 1,4-polycyclohexylenedimethylene terephthalate films, polyethylene naphthalate films, polyester films, cellulose triacetate films, polycarbonate films, polyurethane films, polyimide films, and polyether imide films.

For use, these resin materials may be formed into films with the addition of fillers thereto, they may be uniaxially or biaxially oriented into films, they may be biaxially oriented into films that are higher in the percent of stretch in the widthwise direction than in the direction of flow, and they may be biaxially oriented into films that are higher in the percent of stretch in the direction of flow than in the widthwise direction. The same or different films selected from these films may be laminated together. The same or different resins selected from the starting resins used for these films may be co-extruded into composite films.

Various treatments may be applied to the aforesaid resin films. For instance, silicone-treated polyethylene terephthalate films, corona-treated polyethylene terephthalate films, silicone-treated polypropylene films, and corona-treated polypropylene films may be used.

For the base film 2 or 12, it is also possible to use metal foils, and metal steel bands. Exemplary metal foils and steel bands are copper foils, copper steel bands, aluminum foils, aluminum steel bands, stainless steel bands such as SUS430, SUS301, SUS304, SUS420J2, and SUS631 steel bands, and beryllium steel bands. For use, the aforesaid resin films may be laminated on these metal foils or steel bands.

The base film 2 or 12 has a thickness of 4 to 400 $\mu$m, and preferably 10 to 150 $\mu$m.

Transfer Layer

The transfer layer 3 or 13 comprises, at least, an inorganic component including a glass frit and an organic component removable by firing.

(1) Inorganic Component

For the glass frit, for instance, a glass frit having a softening temperature of 350 to 650° C. and a coefficient of thermal expansion $\alpha_{300}$ of $60 \times 10^{-7}$ to $100 \times 10^{-7}$/° C. may be used. A glass frit having a softening temperature exceeding 650° C. is not preferable because the firing temperature should be elevated. For instance, when the member to be provided with a pattern has low heat resistance, it is thermally deformed at the firing step. A glass frit having a softening temperature of less than 350° C. is again not preferable, because voids are likely to occur due to its thermal fusion before the organic component is completely decomposed and volatilized off by firing. A glass frit having a coefficient of thermal expansion $\alpha_{300}$ of less than $60 \times 10^{-7}$/° C. or greater than $100 \times 10^{-7}$/° C. is not preferable because the member to be provided with a pattern is often susceptible to distortion, etc. due to too large a difference in the coefficient of thermal expansion between the glass frit and the member. Preferably, the glass frit used in the present invention has an average particle size of 0.1 to 10 $\mu$m. For such a glass frit, for instance, glass frits composed mainly of $Bi_2O_3$, ZnO or Pbo may be used.

When such an alkaline development type photosensitive resin composition as described later is used for the organic component removable by firing, it is preferable to use a bismuth type glass frit in view of its resistance to polymers, etc.

The transfer layer 3 or 13 may contain per 100 parts by weight of glass frits at most 50 parts by weight of inorganic powders such as aluminum oxide, boron oxide, silica, titanium oxide, magnesium oxide, calcium oxide, strontium oxide, barium oxide, and calcium oxide powders. Such inorganic powders have preferably an average particle size of 0.1 to 10 $\mu$m, and do not only act as an aggregate to prevent the pattern from spreading during firing but have also a function of controlling reflectance and dielectric constant.

The transfer sheet 1 or 11 having the transfer layer 3 or 13 comprising at least such glass frits as mentioned above for the inorganic component may be used for the fabrication of dielectric layers in plasma display panels.

When the transfer sheet 1 or 11 of the invention is used for barrier formation, a refractory black or white pigment in an inorganic powder form may be incorporated into the transfer layer 3 or 13 so that the amount of extraneous light reflected at the barrier pattern can be reduced with a practical contrast improvement. Exemplary refractory black pigments are Co—Cr—Fe, Co—Mn—Fe, Co—Fe—Mn—Al, Co—Ni—Cr—Fe, Co—Ni—Mn—Cr—Fe, Co—Ni—Al—Cr—Fe, and Co—Mn—Al—Cr—Fe—Si, and exemplary refractory white pigments are titanium oxide, aluminum oxide, silica, and calcium carbonate.

When the transfer sheet 1 or 11 of the invention is used for electrode pattern formation, an electrically conductive powder in an inorganic powder form is incorporated into the transfer layer 3 or 13.

Exemplary conductive powders are Au powders, Ag powders, Cu powders, Ni powders, Al powders, and Ag—Pd powders, which may be used alone or in combination of two or more. Such conductive powders may have various forms such as spherical, sheet, bulk, conical, and rod forms. However, preference is given to a spherical form of conductive powder that is not susceptible to cohesion and is well dispersible, and has an average particle size of 0.05 to 10 $\mu$m, and preferably 0.1 to 5 $\mu$m. The transfer layer 3 or 13 may then contain 2 to 20 parts by weight, and preferably 2 to 10 parts by weight of conductive powders per 100 parts by weight of glass frits.

(2) Organic Component

For the organic component contained in the transfer layer 3 or 13 and removable by firing, a thermoplastic resin may be used.

The thermoplastic resin is used as a binder for the aforesaid inorganic component, and for the purpose of improving transferability. Exemplary thermoplastic resins are polymers or copolymers comprising at least one of methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, 2-hydroxyethyl acrylate, 2-hydroxyethyl methacrylate, 2-hydroxypropyl acrylate, 2-hydroxypropyl methacrylate, styrene, α-methylstyrene, and N-vinyl-2-pyrrolidone, and cellulose derivatives such as ethyl cellulose.

Among others, particular preference is given to polymers or copolymers comprising at least one of methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, 2-hydroxyethyl acrylate, 2-hydroxyethyl methacrylate, 2-hydroxypropyl acrylate, and 2-hydroxypropyl methacrylate, and ethyl cellulose.

Preferably, the thermoplastic resin used herein has a molecular weight of 10,000 to 500,000.

For the organic component contained in the transfer layer 3 or 13 and removable by firing, a photosensitive resin composition, too, may be used.

The photosensitive resin composition contains the aforesaid thermoplastic resin, a monomer and an initiator, and is volatilized and decomposed by firing, so that no carbide can remain in the film obtained upon firing.

The alkaline development type photosensitive resin composition comprises, at least, an alkaline development type polymer, a monomer and an initiator, and is volatilzed and decomposed by firing, so that no carbide can remain in the film obtained upon firing.

Exemplary alkaline development type polymers are polymers or copolymers of at least one of methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, hydroxyethyl acrylate, hydroxyethyl methacrylate, hydroxypropyl acrylate, hydroxypropyl methacrylate, styrene, α-methylstyrene, and N-vinyl-2-pyrrolidone and at least one of acrylic acid, methacrylic acid, a dimer of acrylic acid (e.g., M-5600 made by Toa Synethsis Co., Ltd.), 2-methacryloyloxyethyl succinate, 2-acryloyloxyethyl succinate, 2-methacryloyloxyethyl phthalate, 2-acryloyloxyethyl phthalate, 2-methacryloyloxyethyl hexahydrophthalate, 2-acryloyloxyethyl hexahydrophthalate, itaconic acid, crotonic acid, maleic acid, fumaric acid, vinyl acetate, and acid anhydrides thereof, and carboxyl group-containing cellulose derivatives.

Use may also be made of polymers obtained by adding a glycidyl or hydroxyl group-containing ethylenically unsaturated compound to the aforesaid copolymers. However, the present invention is not limited to these polymers.

The aforesaid polymers have a molecular weight of 5,000 to 300,000, and preferably 30,000 to 150,000, and may be mixed with other polymers, for instance, methacrylic ester polymers, polyvinyl alcohol derivatives, N-methyl-2-pyrrolidone polymers, cellulose derivatives, and styrene polymers.

For the reactive monomer forming a part of the photosensitive resin composition, a compound having at least one polymerizable carbon—carbon unsaturated bond may be used. Exemplary compounds are allyl acrylate, benzyl acrylate, butoxyethyl acrylate, butoxyethylene glycol acrylate, cyclohexyl acrylate, dicyclopentanyl acrylate, 2-ethylhexyl acrylate, glycerol acrylate, glycidyl acrylate, 2-hydroxyethyl acrylate, 2-hydroxypropyl acrylate, isobutyl acrylate, isodecyl acrylate, isooctyl acrylate, lauryl acrylate, 2-methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethylated trimethylolpropane triacrylate, pentaerythritol triacrylate, pentaerythritol tetraacrylate, ethylene oxide-modified pentaerythritol triacrylate, ethylene oxide-modified pentaerythritol tetraacrylate, propylene oxide-modified pentaerythritol triacrylate, propylene oxide-modified pentaerythritol tetraacrylate, triethylene glycol diacrylate, polyoxypropyltrimethylolpropane triacrylate, butylene glycol diacrylate, 1,2,4-butanetriol triacrylate, 2,2,4-trimethyl-1,3-pentanediol diacrylate, diallyl fumarate, 1,10-decanedioldimethyl acrylate, and pentaerythritol hexaacrylate, and compounds wherein the acrylates in the above compounds are substituted by methacrylates as well as γ-methacryloxypropyl trimethoxy silane, and 1-vinyl-2-pyrrolidone. In the present invention, the above reactive monomers may be used alone or in combination of two or more, and may be used in the form of mixtures with other compounds.

For the photopolymerization initiator forming another part of the photosensitive resin composition, use may be made of combinations of photo-reducing dyes with reducing agents such as ascorbic acid, triethanolamine, etc. Exemplary photo-reducing dyes are benzophenone, methyl o-benzoylbenzoate, 4,4-bis(dimethylamine)benzophenone, 4,4-bis(diethylamine)benzophenone, α-amino·acetophenone, 4,4-dichlorobenzophenone, 4-benzoyl-4-methyl diphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methythioxanthone, 2-chlorothioxanthone, 2-isopropylthioxanthone, diethylthioxanthone, benzyldimethylketal, benzylmethoxyethylacetal, benzoin methyl ether, benzoin butyl ether, anthraquinone, 2-tert-butylanthraquinone, 2-amylanthraquinone, β-chloroanthraquinone, anthrone, benzanthrone, dibenzsuberone, methyleneanthrone, 4-azidobenzylacetophenone, 2,6-bis(p-azidobenzylidene) cyclohexane, 2,6-bis(p-azidobenzylidene)-4-methylcyclohexanone, 2-phenyl-1,2-butanedione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxyl-propanetrione-2-(o-benzoyl)oxime, Michler's ketone, 2-methyl-[4-(methylthio)phenyl]-2-morpholino-1-propane, 2-benzyl-2-dimethylamino-1-(4-morpholinophenyl)-butanone-1, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, carbon tetrabromide, tribromophenylsulfone, benzoyl peroxide, eosin, and methylene blue. In the present invention, these photopolymerization initiators may be used alone or in combination of two or more.

The content of such a thermoplastic or photosensitive resin composition in the transfer layer 3 or 13 is 5 to 50 parts by weight, and preferably 10 to 40 parts by weight per 100 parts by weight of the above inorganic component. When the content of the thermoplastic or photosensitive resin composition is below 5 parts by weight, the shape retentivity of the transfer layer 3 or 13 becomes low, and a problem arises especially in connection with the storability and handleability of the transfer sheet in a rolled-up state. In addition, when the transfer sheet 1 or 11 is slit to the desired shape, the transfer sheet 1 or 11 manifests itself in dust form, which has in turn an adverse influence on the fabrication of plasma display panels. When the content of the thermoplastic or photosensitive resin composition exceeds 50 parts by weight, on the other hand, it is impossible to achieve complete removal of the organic component by firing. Consequently, the quality of the electrode pattern obtained upon firing drops because carbides remain therein.

The above thermoplastic or photosensitive resin composition may contain as optional additives photosensitizers, short-stoppers, chain transfer agents, leveling agents, dispersants, transferability-imparting agents, stabilizers, anti-foaming agents, viscosity increasers, suspension agents and releasing agents, if required.

The transferability-imparting agent is added to the composition for the purpose of improving transferability, the fluidity of an ink composition, etc. Exemplary transferability-imparting agents are n-alkyl phthalates such as dimethyl phthalate, dibutyl phthalate and di-n-octyl phthalate; phthalic esters such as di-2-ethylhexyl phthalate, di-isodecyl phthalate, butylbenzyl phthalate, di-isononyl phthalate, ethyl phthalyl ethyl glycolate and butyl phthalyl butyl glycolate; trimellitic esters such as tri-2-ethylhexyl trimellitate, tri-n-alkyl trimellitate, tri-isononyl trimellitate and tri-isodecyl trimellitate; aliphatic dibasic acid esters such as dimethyl adipate, dibutyl adipate, di-2-ethylhexyl adipate, di-isodecyl adipate, dibutyl diglycol adipate, di-2-ethylhexyl azelate, dimethyl sebacate, dibutyl sebacate, di-2-ethylhexyl sebacate, di-2-ethylhexyl malate, acetyl-tri-(2-ethylhexyl)citrate, acetyl-tri-n-butyl citrate and acetyl tributyl citrate; glycol derivatives such as polyethylene glycol benzoate, triethylene glycol-di-(2-ethylhexoate) and polyglycol ether; glycerin derivative such as glycerol triacetate and glycerol diacetyl monolaurate; polyesters comprising sebacic acid, adipic acid, azelaic acid and phthallic acid; low-molecular-weight polyether having a molecular weight of 300 to 3,000, low-molecular-weight poly-α-styrene having the same molecular weight and low-molecular-weight polystyrene having the same molecular weight; orthophosphoric esters such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate and 2-ethylhexyl diphenyl phosphate; ricinoleic esters such as methyl acetyl ricinoleate; polyester-epoxidized esters such as poly-1,3-butanediol adipate and epoxidized soybean oil; and acetic esters such as glyerin triacetate and 2-ethylhexyl acetate.

The dispersant and suspension agent are added to the thermoplastic or photosensitive resin composition for the purpose of improving the dispersion and suspension of the above inorganic component. Exemplary dispersants and suspension agents are those based on phosphoric esters, silicone, castor oil esters, and various surface active agents. Exemplary anti-foaming agents are those based on silicone, acrylics, and various surface active agents, exemplary releasing agents are those based on silicone, fluorine oils, paraffin, fatty acids, fatty esters, castor oils, waxes, and compounds, and exemplary leveling agents are those based on fluorine, silicone, and various surface active agents. These additives may be used in suitable amounts.

Solvents used with the thermoplastic or photosensitive resin composition for the formation of the transfer layer 3 or 13, for instance, are alcohols such as methanol, ethanol, n-propanol, isopropanol, ethylene glycol and propylene glycol; terpenes such as (α- or β-terpineol; ketones such as acetone, methyl ethyl ketone, cyclohexanone, N-methyl-2- pyrrolidone, diethyl ketone, 2-heptanone and 4-heptanone; aromatic hydrocarbons such as toluene, xylene and tetramethylbenzene; glycol ethers such as cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether and triethylene glycol monoethyl ether; acetic esters such as ethyl acetate, butyl acetate, cellosolve acetate, ethyl cellosolve acetate, butyl cellosolve acetate, carbitol acetate, ethyl carbitol acetate, butyl carbitol acetate, propylene glycol monomethyl acetate, 2-ethoxyethyl acetate, cyclohexyl acetate, 2-ethoxyethyl acetate and 3-methoxybuty acetate; ethylene glycol dialkyl ether; dipropylene glycol dialkyl ether; ethyl 3-ethoxypropionate; methyl benzoate; N,N-dimethylacetamide; and N,N-dimethylformamide.

The above transfer layer-forming components may be coated on the base film 2 or 12 by known coating means such as direct gravure coating, gravure reverse coating, reverse roll coating, slide die coating, slit die coating, comma coating, and slit reverse coating, and then dried.

The transfer layer is dried to a thickness of 5 $\mu$m to 25 $\mu$m for electrode pattern formation, to a thickness of 10 $\mu$m to 100 $\mu$m for dielectric layer formation, and to a thickness of 70 $\mu$m to 300 $\mu$m for the formation of a PDP barrier layer.

Protective Film

For the protective film 14 that forms the transfer sheet of the invention, it is preferable to use a material that has such a surface property as to allow the surface gloss of the transfer layer 13 upon release of the protective film 14 therefrom to be confined within the range of 30 to 110 as measured by a gloss meter, and is flexible and less susceptible to large deformation under tension or pressure. Examples of such a material are polyethylene films, ethylene-vinyl acetate copolymer films, ethylene-vinyl alcohol copolymer films, polypropylene films, polystyrene films, polymethacrylic ester films, polyvinyl chloride films, polyvinyl alcohol films, polyvinyl butyral films, nylon films, polyether ether ketone films, polysulfone films, polyether sulfone films, polytetrafluoroethylene-perfluoroalkylvinyl ether films, polyvinyl fluoride films, tetrafluoroethylene-ethylene films, tetrafluoroethylene-hexafluoropropylene films, polychlorotrifluoroethylene films, polyvinylidene fluoride films, polyethylene terephthalate films, cellulose triacetate films, polycarbonate films, polyurethane films, polyimide films, and polyether imide films.

For use, these resin materials may be formed into films with the addition of fillers thereto, they may be uniaxially or biaxially oriented into films, they may be biaxially oriented into films that are higher in the percent of stretch in the widthwise direction than in the direction of flow, and they may be biaxially oriented into films that are higher in the percent of stretch in the direction of flow than in the widthwise direction. The same or different films selected from these films may be laminated together. The same or different resins selected from the starting resins used for these films may be co-extruded into composite films. Of these films preference is given to biaxially oriented polyester films. Various treatments may be applied to the aforesaid resin films. For instance, silicone-treated polyethylene terephthalate films, corona-treated polyethylene films, corona-treated polyethylene films, silicone-treated polypropylene films, and corona-treated polypropylene films may be used. The protective film such as one mentioned above should have preferably a thickness of 4 to 400 $\mu$m, and preferably 6 to 150 $\mu$m.

The protective film may be either laminated directly on the transfer layer or laminated on the transfer layer with an acrylic resin or other adhesive layer sandwiched between them.

Reference is then made to how to form a PDP electrode pattern and a dielectric layer, using the first transfer sheet of the invention.

Figure 4:
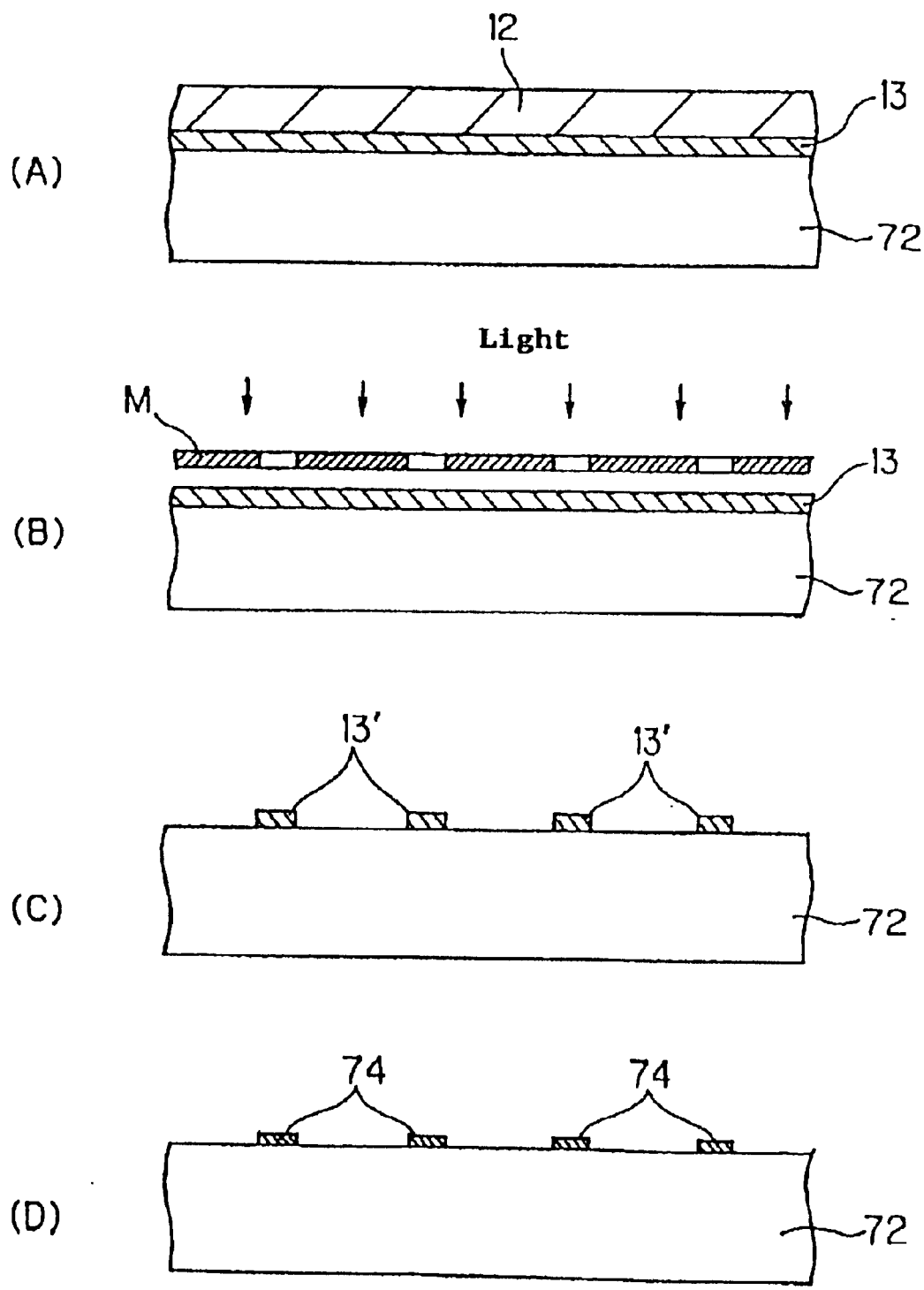
FIG. 4 is a process sequence for illustrating one example of electrode pattern formation using the first, third, fifth, and sixth transfer sheets of the invention.

FIG. 4 is a process sequence for the formation of a pattern for an address electrode 74 in a PDP back panel plate 71, using the first transfer sheet 11 of the invention. It is here to be noted that the transfer layer 13 in the transfer sheet 11 contains a negative photosensitive resin composition as the organic component removable by firing, and that the address electrode 74 is formed directly on a back glass substrate 72.

Referring here to FIG. 4, a protective film 14 is first released from the transfer sheet 11. Then, the transfer sheet 11 is pressed on a transfer layer 3 side against the back glass substrate 72. Then, the transfer layer 3 is transferred on the substrate 72 by release of a base film 12 from the transfer sheet (FIG. 4(A)). At this transfer step, the transfer layer 3 can be well transferred to the substrate 72 because the surface roughness Ra of the transfer layer 13 in the transfer sheet 11 is at most 0.2 $\mu$m, so that the transfer layer 13 can be improved in the surface smoothness of the side of the transfer layer 13 to be transferred and, hence, can be in closer contact with the back glass substrate 72.

It is here to be noted that when heating is needed for transfer of the transfer layer 13 to the back glass substrate 72, the substrate 72 may be heated independently or using a pressing roll.

Then, the transfer layer 13 is exposed to light using a photomask M (FIG. 4(B)). It is here to be noted that when a light-transmitting film is used for the base film 12, the transfer layer 13 may be exposed to light before release of the base film 12 therefrom.

Subsequently, the transfer layer 13 is developed, thereby forming a pattern 3' comprising a conductive photosensitive resin layer on the back glass substrate 72 (FIG. 4(C)). Finally, the pattern 3' is fired to remove the organic component therefrom, thereby forming the address electrode pattern 74 (FIG. 4(D)).

In this embodiment of the invention, such a transfer sheet of the invention as shown in FIG. 2 is used. When a transfer sheet having no protective film thereon such as one shown in FIG. 1 is used, the pattern may be formed in the same operation as shown in FIG. 4 after the direct pressing of the transfer layer in the transfer sheet against the back glass substrate 72.

Then, the formation of a dielectric layer 75 in the above PDP back panel plate 71 is explained.

Figure 5:
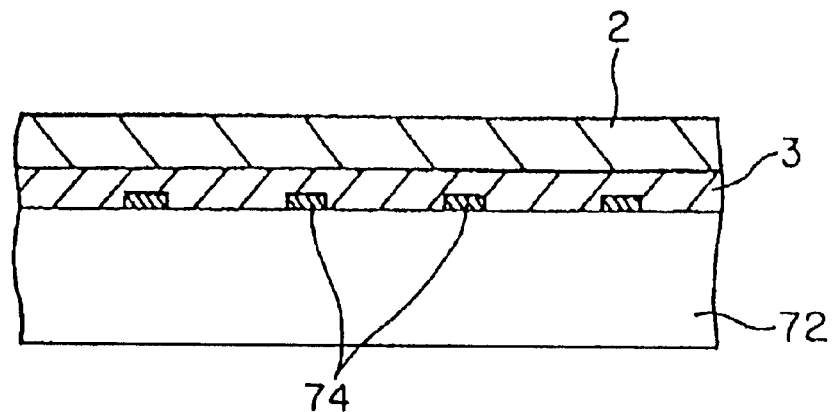
FIG. 5 is a process sequence for illustrating one example of dielectric layer formation using the first, second, fourth, and sixth transfer sheets of the invention.
Figure 5:
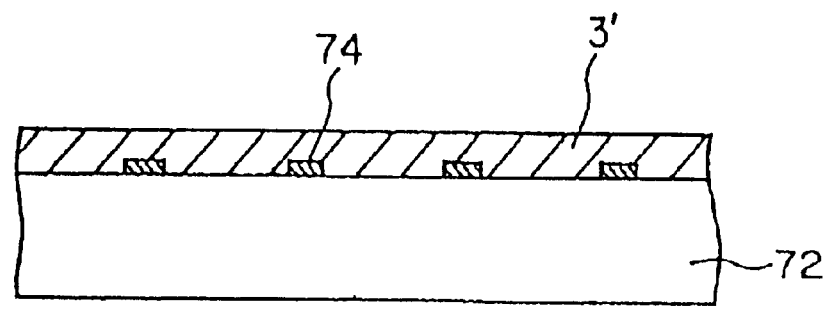
Figure 5:
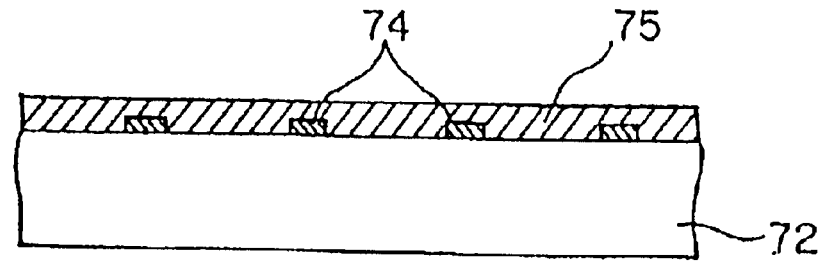

FIG. 5 is a process sequence for the formation of the dielectric layer 75, using the first transfer sheet of the invention.

Referring now to FIG. 5, a transfer sheet 1 is first pressed on a transfer layer 3 side against a back glass substrate 72 having an address electrode pattern 74 (FIG. 5(A)), after which a base film 2 is released therefrom to transfer the transfer layer 3 to the substrate 72, thereby obtaining a transfer pattern 3' (FIG. 5(B)). At this transfer step, the transfer layer 3 can be well transferred to the substrate 72 because the surface roughness Ra of the transfer layer 3 in the transfer sheet 1 is at most 0.4 $\mu$m, so that the transfer layer 3 can be improved in the surface smoothness of the side of the transfer layer 3 to be transferred and, hence, can be in closer contact with the back glass substrate 72 and the address electrode pattern 74. It is here to be noted that when heating is needed for transfer of the transfer layer 3 to the back glass substrate 72, the substrate 72 may be heated independently or using a pressing roll.

Thereafter, the transfer pattern 3' is fired to remove the organic component therefrom to form the dielectric layer 75 (FIG. 5(C)).

In this embodiment of the invention, such a transfer sheet of the invention as shown in FIG. 1 is used. When a transfer sheet having a protective film thereon such as one shown in FIG. 2 is used, the dielectric layer may be formed in the same operation as shown in FIG. 5 after release and removal of the protective film.

When a PDP barrier is formed using the transfer sheet of the invention, either the transfer sheet having no protective film thereon or the transfer sheet having a protective film thereon may be used. When the organic component of the transfer layer in the transfer sheet is sensitive to light, the transferred layer is exposed to light in a pattern form, developed, and finally fired, so that a given barrier pattern can be formed. When the organic component of the transfer layer in the transfer sheet is not sensitive to light, the transferred layer is etched as by sandblasting through a mask, and finally fired, so that a given barrier pattern can be formed.

The first transfer sheet of the invention are now explained with reference to Examples 1 to 3.

EXAMPLE 1

First, an ink composition composed of the following components was prepared as the ink composition for electrode pattern formation.

| Components of the Ink Composition | |
|---|---|
| Silver powders (in a spherical form having an average particle size of 1 μm) | 65 parts by weight |
| Glass frits (of the non-alkali type composed mainly of $Bi_2O_3$ and having a softening point of 500° C. and an average particle size of 1 μm) | 3 parts by weight |
| n-Butyl methacrylate/2-hydroxypropyl methacrylate/methacrylic acid copolymer at a molar ratio of 6/2/2 | 9 parts by weight |
| Pentaerythritol tri/tetraacrylate | 8 parts by weight |
| Photopolymerization initiator (Irgacure 369, Ciba-Geigy) | 1 parts by weight |
| 3-Methoxybutyl acetate | 20 parts by weight |

Then, the above ink composition was coated by a blade coating process on a polyethylene terephthalate film (T-60, Toray Industries, Inc.) provided as the base film, and dried at 80° C. for 2 minutes to form a transfer layer of 18 μm in thickness.

Next, a protective film or a silicone-treated polyethylene terephthalate film (SP-PET-03-25-C, Tosero Co., Ltd.) was laminated on the transfer layer to form such a transfer sheet (sample 1) as shown in FIG. 2.

The above ink components were dispersed together under varying dispersion conditions to prepare various ink compositions, which were then used to make transfer sheets as mentioned above (sample 2, and comparative samples 1 and 2). In comparative sample 1, the same ink composition as used to make sample 2 was used for transfer layer formation and the protective film used was a sand-matted polyethylene terephthalate film (Type A, Toray Industries, Inc.) having surface smoothness lower than that of the above protective film. Comparative sample 2 was prepared using an ink composition that was poorly dispersed by intention.

Such a transfer sheet (sample 3) as shown in FIG. 1, wherein a transfer layer was formed using the same ink composition as in sample 2 with no protective film laminated thereon, was prepared together with such a transfer sheet (comparative sample 3) as shown in FIG. 1, wherein a transfer layer was formed using the same ink composition as in comparative sample 2 with no protective film laminated thereon.

The surface roughness Ra of the transfer layer in each of the thus prepared transfer sheets (samples 1, 2, and comparative samples 1, 2) before the protective films were laminated thereon, and the surface roughness Ra of the transfer layer in each of the transfer sheets (sample 3, and comparative sample 3) were measured by Dicktack 16000, Beeco Co., Ltd. Further, whether or not air bubbles were found in the transfer sheets (samples 1, 2, and comparative samples 1, 2) with the protective films laminated thereon was observed. The results are reported in Table 1.

Then, each of the above transfer sheets (samples 1, 2, and comparative samples 1, 2) was slit to a given width, and rolled around an ABS resin core for storage at 25° C. for 30 days. Thereafter, the protective film was released from each transfer sheet to measure the surface roughness Ra of the transfer layer in the same manner as mentioned above. The results are also reported in Table 1.

After the above storage, the protective film was released from each of the transfer sheets (samples 1, 2, and comparative samples 1, 2), which was then pressed on a glass substrate heated to 50° C., using an auto-cutting laminator including a roll heated to 80° C. Similarly, each of the above transfer sheets (sample 3, and comparative sample 3) was slit to a given width, and pressed on a glass substrate heated to 50° C., using an auto-cutting laminator including a roll heated to 80° C.

After each transfer sheet was cooled down to room temperature, the base film was released therefrom to transfer the transfer layer to the glass substrate. At this transfer step, the transferability of each of the transfer sheets (samples 1 to 3, and comparative samples 1 to 3) was observed. The results are shown in Table 1.

Then, the transfer layer was exposed to ultraviolet radiation of 400 mJ/cm$^2$ (from a light source, i.e., a super high-pressure mercury-vapor lamp) via a negative pattern mask (with an opening line width of 90 μm) for plasma display panel electrodes. Following this, the transfer layer was developed with a 0.5% aqueous solution of sodium carbonate to obtain a given pattern. Finally, the glass substrate was fired at 600° C. to form an electrode pattern.

The appearance of the thus formed electrode pattern was observed. The results are shown in Table 1.

TABLE 1

| | Surface Roughness Ra (μm) | | | | Appearance of Electrode Pattern |
|---|---|---|---|---|---|
| Transfer Sheet | before lamination of protective film | after release of protective film | Air Bubbles | Transferability | |
| Sample 1 | 0.4 | 0.1 | not found | good | good |
| Sample 2 | 0.1 | 0.08 | not found | good | good |
| Comp. Sample 1 | 0.1 | 0.6 | many bubbles found | many bubbles found | many defects and breaks found |

TABLE 1-continued

| Transfer Sheet | Surface Roughness Ra (μm) | | Air Bubbles | Transfer-ability | Appearance of Electrode Pattern |
| --- | --- | --- | --- | --- | --- |
| | before lamination of protective film | after release of protective film | | | |
| Comp. Sample 2 | 0.8 | 0.3 | many bubbles found | many bubbles found | many defects and breaks found |
| Sample 3 | 0.1 | — | — | good | good |
| Comp. Sample 3 | 0.8 | — | — | many bubbles found | many defects and breaks found |

From Table 1, it is found the first transfer sheets (samples 1, 2) of the invention have no air bubbles trapped between the transfer layers and the protective films, and the transfer sheets of the invention (samples 1 to 3) have satisfactory transferability to the glass substrates. It is also found that the electrode patterns obtained using these transfer sheets have uniform thicknesses and line widths, and are formed with high accuracy.

On the other hand, the transfer sheet (comparative sample 1) wherein the surface roughness Ra of the transfer layer before lamination of the protective film thereon is lower than 0.4 μm but the surface roughness Ra of the transfer layer upon release of the protective film is greater than 0.2 μm, and the transfer sheet (comparative sample 2) wherein the surface roughness Ra of the transfer layer before lamination of the protective film thereon exceeds 0.4 μm and the surface roughness Ra of the transfer layer upon release of the protective film exceeds 0.2 μm have air bubbles trapped between the transfer layer and the protective film. The transfer sheets (comparative samples 1, 2 and 3) are found to be poor in transferability to the glass substrates because the transfer layers broken or were partly detached from the glass substrates. In addition, the electrode patterns formed using these transfer sheets are found to have many defects.

EXAMPLE 2

First, an ink composition having the following components was prepared for dielectric layer formation.

| Components of the Ink Composition | |
| --- | --- |
| Glass frits (of the non-alkali type composed mainly of $Bi_2O_3$, ZnO and $B_2O_3$ and having an average particle size of 3 μm) | 65 parts by weight |
| n-Butyl methacrylate/2-hydroxyethyl methacrylate copolymer (at a molar ratio of 8/2) | 15 parts by weight |
| Adipate type transferability-imparting agent (Adecaizer RS107, Asahi Denka Kogyo Co., Ltd.) | 10 parts by weight |
| $TiO_2$ | 7 parts by weight |
| $Al_2O_3$ | 5 parts by weight |
| Propylene glycol monomethyl ether | 50 parts by weight |

Then, the above ink composition was coated by a blade coating process on a polyethylene terephthalate film (T-60, Toray Industries, Inc.) provided as the base film, and dried at 90° C. for 2 minutes to form a transfer layer of 30 μm in thickness.

Next, a protective film or a silicone-treated polyethylene terephthalate film (SP-PET-03-25-C, Tosero Co., Ltd.) of 25 μm in thickness was laminated on the transfer layer to form such a transfer sheet (sample A) as shown in FIG. 2.

The above ink components were dispersed together under varying dispersion conditions to prepare various ink compositions, which were then used to make transfer sheets as mentioned above (sample B, and comparative samples A and B). In comparative sample A, the same ink composition as in sample B was used for transfer layer formation and the protective film used was a sand-matted polyethylene terephthalate film (Type A, Toray Industries, Inc.) having surface smoothness lower than that of the above protective film. Comparative sample B was prepared using an ink composition that was poorly dispersed by intention.

Such a transfer sheet (sample C) as shown in FIG. 1, wherein a transfer layer was formed using the same ink composition as in sample B with no protective film laminated thereon, was prepared together with such a transfer sheet (comparative sample C) as shown in FIG. 1, wherein a transfer layer was formed using the same ink composition as in comparative sample B with no protective film laminated thereon.

The surface roughness Ra of the transfer layer in each of the thus prepared transfer sheets (samples A, B, and comparative samples A, B) before the protective films were laminated thereon, and the surface roughness Ra of the transfer layer in each of the transfer sheets (sample D, and comparative sample D) were measured in the same manner as in Example 1. Further, whether or not air bubbles were found in the transfer sheets (samples A, B, and comparative samples A, b) with the protective films laminated thereon was observed. The results are reported in Table 2.

Then, each of the above transfer sheets (samples A, B, and comparative samples A, B) was slit to a given width, and rolled around an ABS resin core for storage at 25° C. for 30 days. Thereafter, the protective film was released from each transfer sheet to measure the surface roughness Ra of the transfer layer in the same manner as in Example 1. The results are also reported in Table 1.

After the above storage, the protective film was released from each of the transfer sheets (samples A, B, and comparative samples A, B), which was then pressed on a glass substrate (with an electrode pattern already formed thereon) heated to 100° C., using an auto-cutting laminator including a roll heated to 140° C. Similarly, each of the above transfer sheets (sample C, and comparative sample C) was slit to a given width, and pressed on a glass substrate (with an electrode pattern already formed thereon) heated to 100° C., using an auto-cutting laminator including a roll heated to 140° C.

After each transfer sheet was cooled down to room temperature, the base film was released therefrom to transfer the transfer layer to the glass substrate. At this transfer step, the transferability of each of the transfer sheets (samples A to C, and comparative samples A to C) was observed. The results are shown in Table 2.

Finally, each glass substrate was fired at 580° C. to form a dielectric layer.

The surface states of the thus formed dielectric layers were observed. The results are shown in Table 2.

TABLE 2

| Transfer Sheet | Surface Roughness Ra (μm) | | Air Bubbles | Transfer-ability | Appearance of Electrode Pattern |
|---|---|---|---|---|---|
| | before lamination of protective film | after release of protective film | | | |
| Sample A | 0.4 | 0.1 | not found | good | good |
| Sample B | 0.1 | 0.08 | not found | good | good |
| Comp. Sample A | 0.1 | 0.6 | many bubbles found | many bubbles found | electrode partly bared with some variations |
| Comp. Sample B | 0.8 | 0.3 | many bubbles found | many bubbles found | electrode partly bared with some variations |
| Sample C | 0.1 | — | — | good | good |
| Comp. Sample C | 0.8 | — | — | many bubbles found | electrode partly bared with some variations |

From Table 2, it is found the first transfer sheets (samples A, B) of the invention have no air bubbles trapped between the transfer layers and the protective films, and the transfer sheets of the invention (samples A to C) have satisfactory transferability to the glass substrates. It is also found that the dielectric layers obtained using these transfer sheets have uniform thicknesses, and satisfactory surface flatness as well.

On the other hand, the transfer sheet (comparative sample A) wherein the surface roughness Ra of the transfer layer before lamination of the protective film thereon is lower than 0.4 μm but the surface roughness Ra of the transfer layer upon release of the protective film is greater than 0.2 μm, and the transfer sheet (comparative sample B) wherein the surface roughness Ra of the transfer layer before lamination of the protective film thereon exceeds 0.4 μm and the surface roughness Ra of the transfer layer upon release of the protective film exceeds 0.2 μm have air bubbles trapped between the transfer layer and the protective film. The transfer sheets (comparative samples A, B and C) are found to be poor in transferability to the glass substrates because air bubbles are trapped between the transfer layers and the glass substrates (with electrodes formed thereon), and the close contact of the transfer layers with the glass substrates becomes worse. In addition, the dielectric layers used using these transfer sheets are found to be not uniform even upon firing, and the electrodes were bare in some spots.

EXAMPLE 3

First, an ink composition consisting of the following components was prepared as the ink composition for barrier formation.

| Components of the Ink Composition | |
|---|---|
| Glass frits (composed mainly of PbO, SiO$_2$ and B$_2$O$_3$ and having an average particle size of 3 μm, a softening point of 560° C. and a coefficient of thermal expansion of 65 × 10$^{-7}$/° C.) | 65 parts by weight |
| α-Alumina DA-40 (Iwatani Chemical Industries, Ltd.) | 10 parts by weight |
| Dipyrroxide Black #9510 (Dainichi Seika Kogyo Co., Ltd.) | 10 parts by weight |
| n-Butyl methacrylate/2-hydroxyethyl methacrylate copolymer (at a molar ratio of 8/2) | 4 parts by weight |
| Di-2-ethylhexyl phthalate (having a boiling point of 390° C.) | 5 parts by weight |
| Dibutyl phthalate (having a boiling point of 282° C.) | 3 parts by weight |
| Dipropylene glycol monomethyl ether | 15 parts by weight |

Then, the above ink composition was coated by a blade coating process on a 75 μm thick polyethylene terephthalate film (T-60, Toray Industries, Inc.) provided as the base film, and dried at 120° C. for 5 minutes to form a transfer layer of 180 μm in thickness.

Next, a protective film or a silicone-treated polyethylene terephthalate film (SP-PET-03-25-C, Tosero Co., Ltd.) was laminated on the transfer layer to form such a transfer sheet (sample I) as shown in FIG. 2.

The above ink components were dispersed together under varying dispersion conditions to prepare various ink compositions, which were then used to make transfer sheets as mentioned above (sample II, and comparative samples I and II). In comparative sample I, the same ink composition as in sample II was used for transfer layer formation and the protective film used was a sand-matted polyethylene terephthalate film (Type A, Toray Industries, Inc.) having surface smoothness lower than that of the above protective film. Comparative sample II was prepared using an ink composition that was poorly dispersed by intention.

Such a transfer sheet (sample III) as shown in FIG. 1, wherein a transfer layer was formed using the same ink composition as in sample II with no protective film laminated thereon, was prepared together with such a transfer sheet (comparative sample III) as shown in FIG. 1, wherein a transfer layer was formed using the same ink composition as in comparative sample II with no protective film laminated thereon.

The surface roughness Ra of the transfer layer in each of the thus prepared transfer sheets (samples I, II, and comparative samples I, II) before the protective films were laminated thereon, and the surface roughness Ra of the transfer layer in each of the transfer sheets (sample IV, and comparative sample IV) were measured as in Example 1. Further, whether or not air bubbles were found in the transfer sheets (samples I, II and comparative samples I, II) with the protective films laminated thereon was observed. The results are reported in Table 3.

Then, each of the above transfer sheets (samples I, II, and comparative samples I, II) was slit to a given width, and rolled around an ABS resin core for storage at 25° C. for 10 days. Thereafter, the protective film was released from each transfer sheet to measure the surface roughness Ra of the transfer layer in the same manner as in Example 1. The results are also reported in Table 3.

After the above storage, the protective film was released from each of the transfer sheets (samples I, II, and comparative samples I, II), which was then pressed on a glass substrate (with the electrode pattern and dielectric layer already formed thereon) heated to 50° C., using an auto-cutting laminator including a roll heated to 100° C. Similarly, each of the above transfer sheets (sample III, and comparative sample III) was slit to a given width, and pressed on a glass substrate (with the electrode pattern and dielectric layer already formed thereon) heated to 50° C., using an auto-cutting laminator including a roll heated to 100° C.

After each transfer sheet was cooled down to room temperature, the base film was released therefrom to transfer the transfer layer to the glass substrate. At this transfer step, the transferability of each of the transfer sheets (samples I to III, and comparative samples I to III) was observed. The results are shown in Table 3.

Subsequently, the glass substrate with the transfer layer transferred thereon was held in a 300° C. oven for 40 minutes for removal of the high-boiling solvent. Using a roll heated to 120° C., a negative dry film resist with a protective film provided thereon (NCP 225, Nippon Synthesis Chemistry Industries, Ltd.) was laminated on the transfer layer. Then, a line mask pattern having a line width of 80 $\mu$m and a pitch of 220 $\mu$m was aligned with the photoresist layer for exposure to ultraviolet radiation (at a wavelength of 364 nm, an intensity of 200 $\mu$w/cm$^2$ and an exposure of 120 mJ/cm$^2$). After release of the protective film from the photoresist layer, the transfer layer was spray-developed using a 1% by weight aqueous solution of sodium carbonate maintained at a temperature of 30° C., thereby forming a resist pattern corresponding to the line pattern mask.

Using this resist pattern as a mask and brown fused alumina #800 as an abrasive, the transfer layer was sandblasted at an injection pressure of 1 kg/cm$^2$. After the resist pattern was spray-released from the transfer layer in a 2% by weight aqueous solution of sodium carbonate kept at a temperature of 30° C., the transfer layer was washed with water, then dried in an 80° C. oven for 15 minutes, and finally fired at a peak temperature of 550° C. to form a barrier pattern.

The appearance of the thus formed barrier patterns was observed. The results are shown in Table 3.

TABLE 3

| Transfer Sheet | Surface Roughness Ra ($\mu$m) | | Air Bubbles | Transfer-ability | Appearance of Barrier Pattern |
| --- | --- | --- | --- | --- | --- |
| | before lamination of protective film | after release of protective film | | | |
| Sample I | 0.4 | 0.1 | not found | good | good |
| Sample II | 0.1 | 0.08 | not found | good | good |
| Comp. Sample I | 0.1 | 0.6 | many bubbles found | many bubbles found | many breaks in the barrier local thinning of the barrier |
| Comp. Sample II | 0.8 | 0.3 | many bubbles found | many bubbles found | many breaks in the barrier local thinning of the barrier |
| Sample III | 0.1 | — | — | good | good |
| Comp. Sample III | 0.8 | — | — | many bubbles found | many breaks in the barrier local thinning of the barrier |

From Table 3, it is found that each of the first transfer sheets (sample I, and sample II) of the invention has no air bubbles trapped between the transfer layer and the protective film. Further, the transfer sheets (samples I, II, and III) of the invention show good transferability with respect to the glass substrates. Furthermore, the barrier patterns obtained using these transfer sheets were found to have uniform thicknesses and line widths and are formed with high accuracy.

On the other hand, the transfer sheet (comparative sample I) wherein the surface roughness Ra of the transfer layer before lamination of the protective film thereon is lower than 0.4 $\mu$m but the surface roughness Ra of the transfer layer upon release of the protective film therefrom is greater than 0.2 $\mu$m, and the transfer sheet (comparative sample II) wherein the surface roughness Ra of the transfer layer before lamination of the protective film thereon exceeds 0.4 $\mu$m and the surface roughness Ra of the transfer layer upon release of the protective film therefrom exceeds 0.2 $\mu$m have air bubbles trapped between the transfer layer and the protective film. The transfer sheets (comparative samples I, II and III) are then found to be poor in transferability to the glass substrates due to breaks in the transfer layers, local peeling of the transfer layers from the glass substrates, etc. Further, the barrier patterns obtained using these transfer sheets are found to be poor in linearity with many defects.

The second transfer sheet of the invention is then explained. With the second transfer sheet of the invention, it is possible to form, with high accuracy, primer layers, dielectric layers on front and back panel plates, photosensitive black matrix layers, and photosensitive rib layers for use with PDPs.

It is currently required that dielectric layers for used with PDPs be fabricated at ever lower costs while their thickness and pattern accuracy is maintained at ever higher levels. The second transfer sheet of the invention is particularly suitable for forming dielectric layers for PDPs with ease.

Referring to FIG. 1, the transfer layer 3 is releasably provided on the base film 2 and comprises, at least, an inorganic component including a glass frit and an organic component removable by firing. This transfer layer 3 should then have a surface gloss between 20 and 110, preferably 30 and 110, and more preferably 40 and 90.

Referring to FIG. 2, the surface gloss of the transfer layer 13 before the protective film 14 is releasably provided thereon, and the surface gloss of the transfer layer 13 after the protective film 14 is released therefrom should be between 30 and 110, and preferably between 40 and 100.

That the surface glass of the transfer layer is in the range of 20 to 110 (the surface gloss of the transfer layer from which the protective film is released is in the range of 30 to 110) is tantamount to be that the surface smoothness of the transfer layer is improved for lack of defects such as agglomerates or pinholes due to poor dispersion of the inorganic component. Such a transfer layer serves well to prevent air bubbles from being trapped between the transfer layer and the protective film, and shows excellent transferability to an application surface so that it can come into closer contact with the application surface upon transfer.

A transfer sheet 1 or 11 of the invention has an improved surface smoothness because the surface gloss of the transfer layer is in the range of 20 to 110, as mentioned above. In the transfer sheet 11, it is possible to prevent air bubbles from being trapped between the transfer layer 13 and the protective film 14 upon lamination of the protective film 14 thereon. The transfer layer 3 or 13 shows excellent transferability to an application surface so that it can come in closer contact with the application surface (the transfer layer of the transfer sheet 11 from which the protective film 14 is removed shows excellent transferability to the application surface).

In the present invention, the surface gloss of the transfer layer is represented by a value found using a gloss meter, VGS-1001DP made by Nippon Denshoku Kogyo Co., Ltd., and is an index to the surface properties of the transfer layer 3 or 13. When the transfer layer 3 or 13 has surface defects such as agglomerates or pinholes due to poor dispersion of the inorganic component, a drop of the surface smoothness of the transfer layer is reflected on the surface gloss thereof; the surface gloss of the transfer layer becomes lower than 20. Usually, the surface smoothness of the transfer layer 13 is improved by provision of the protective film 14 thereon. When the smoothness of the surface of contact of the transfer layer 13 with the protective film 14 is in bad condition, however, the surface smoothness of the transfer layer 13 upon release of the protective film 14 therefrom becomes low. This is then reflected on the surface gloss of the transfer layer 13; that is, the surface gloss of the transfer layer 13 becomes lower than 30.

By ensuring that the surface gloss of the transfer layer 3 is 20 or greater and the surface glass of the transfer layer 13 after release of the protective film 14 therefrom is 30 or greater, the transfer layer of the transfer sheet can thus be improved in the surface properties. In other words, the higher the surface gloss of the transfer layer 3 or 13, the more improved the surface properties thereof are. At a surface gloss exceeding 110, however, no further improvements in the surface properties are expected; there are rather production cost increases or production yield reductions. It is consequently preferable that the upper limit to the surface gloss is about 110.

On the premise that the second transfer sheet of the invention is used for dielectric layer formation, the structures of the base film, transfer layer, and protective film thereof may be the same as already explained in conjunction with the first transfer sheet of the invention. However, it is to be understood that the surface gloss of the transfer layer 3 or 13 is affected by the powder shape and content of the inorganic component, the type and content of the organic component, the solvent used, the coating conditions applied, etc., and so the transfer layer 3 or 13 should be formed under such conditions as to allow the surface gloss to come within the aforesaid range.

Then, reference is made to how to form the dielectric layer 75 in the PDP back plate 71 using the second transfer sheet of the invention.

Figure 6:
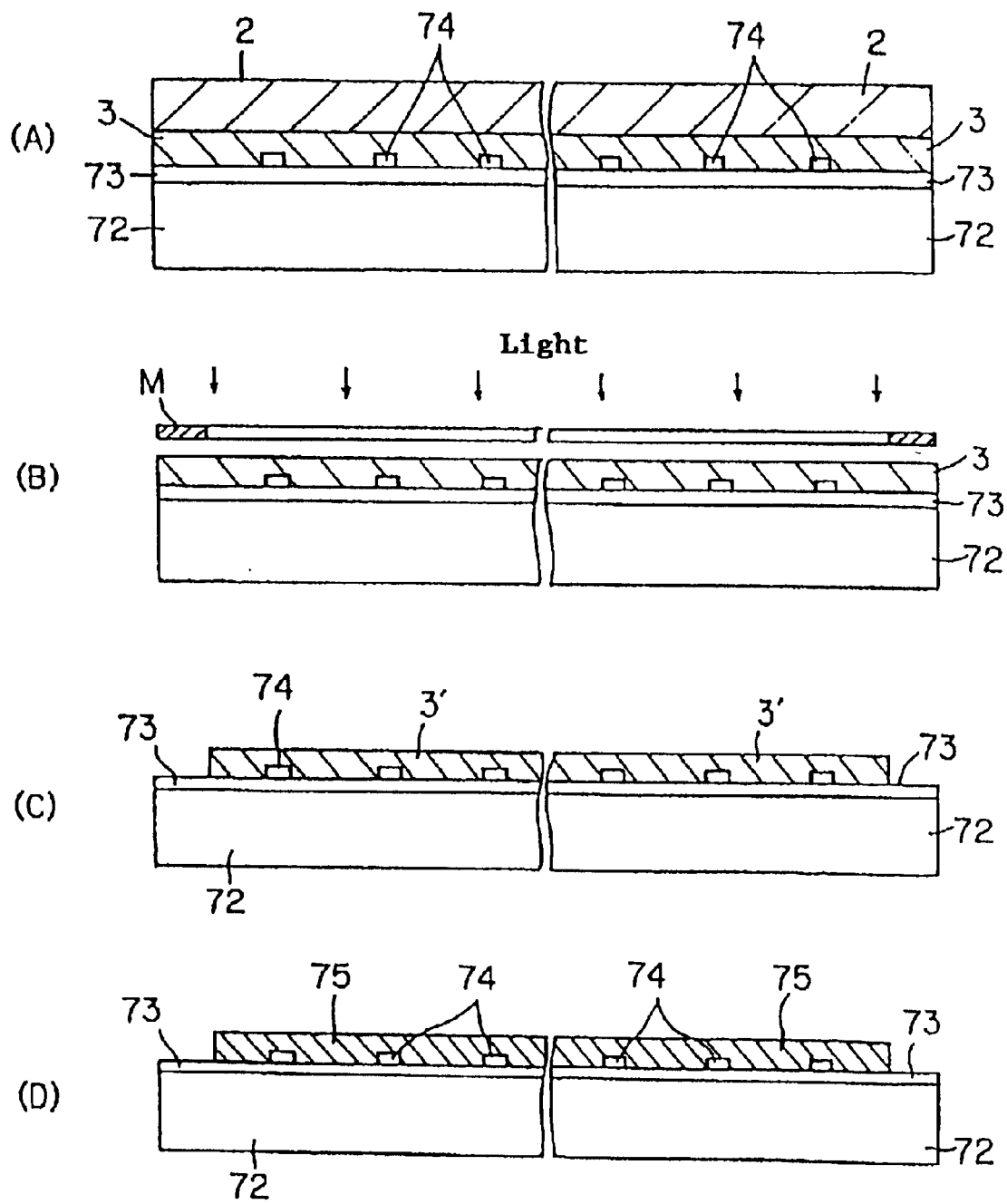
FIG. 6 is a process sequence for illustrating one example of dielectric layer formation using the first, second, fourth, and sixth transfer sheets of the invention.

FIG. 6 is a process sequence of how to form the dielectric layer 75 using the transfer sheet 1 of the invention.

Referring here to FIG. 6, the transfer sheet 1 is first pressed on the side of the transfer layer 3 against the back glass substrate 72 comprising a primer layer 73 and an address electrode pattern 74 provided thereon. Then, the transfer layer 3 is transferred to the substrate 72 by release of the base film 2 from the transfer sheet 1 (FIG. 6(A)). At this transfer step, the transfer layer 3 can be well transferred to the substrate 72 because the surface gloss of the transfer layer 3 in the transfer sheet 1 is in the range of 20 to 110, so that the transfer layer 3 can be improved in the surface smoothness of the side of the transfer layer 3 to be transferred and, hence, can be in closer contact with the primer layer 73 and address electrode pattern 74. When heating is needed for transfer of the transfer layer 3 on the back glass substrate 72, the substrate 72 may be heated independently or using a pressing roll.

Then, the transfer layer 3 is exposed to light using a photomask M (FIG. 6(B)). It is here to be noted that when a light-transmitting film is used for the base film 12, the transfer layer 3 may be exposed to light before release of the base film 12 therefrom.

Subsequently, the transfer layer 3 is developed, thereby forming a pattern 3' comprising a photosensitive resin layer on the back glass substrate 72 (FIG. 6(C)). Finally, the pattern 3 is fired to remove the organic component therefrom, thereby forming the dielectric layer 75 (FIG. 6(D)).

In this embodiment of the invention, such a transfer sheet of the invention as shown in FIG. 1 is used. When a transfer sheet having a protective film thereon such as one shown in FIG. 2 is used, the dielectric layer may be formed in the same operation as shown in FIG. 6 after release and removal of the protective film. Also, when the dielectric layer 75 is provided in a solid form rather than according to the desired pattern, it is preferable to remove the organic component by firing immediately after transfer of the transfer layer.

The second transfer sheet of the invention is now explained more specifically with reference to Example 4.

EXAMPLE 4

First, an ink composition having the following components was prepared for dielectric layer formation.

| Components of the Ink Composition | |
|---|---|
| Glass frits (of the non-alkali type composed mainly of $Bi_2O_3$, ZnO and $B_2O_3$ and having an average particle size of 3 μm) | 70 parts by weight |
| $TiO_2$ | 7 parts by weight |
| $Al_2O_3$ | 5 parts by weight |

It is here to be noted that the above inorganic component mixture had a softening point of 570° C., a glass transition temperature Tg of 485° C. and a coefficient of thermal expansion $(\alpha_{300})$ of $80 \times 10^{-7}/°$ C.

| | |
|---|---|
| n-Butyl methacrylate/2-hydroxyethyl methacrylate copolymer (at a molar ratio of 8/2, and having a molecular weight of 300,000) | 20 parts by weight |
| Adipate type transferability-imparting agent (Adecaizer RS107, Asahi Denka Kogyo Co., Ltd.) | 12 parts by weight |
| Propylene glycol monomethyl ether | 50 parts by weight |

Then, the above ink composition was coated by a blade coating process on a polyethylene terephthalate film (T-60, Toray Industries, Inc.) provided as the base film, and dried at 100° C. for 2 minutes to form a transfer layer of 25 μm in thickness.

Next, a protective film or a silicone-treated polyethylene terephthalate film (SP-PET-03-25-C, Tosero Co., Ltd.) of 25 μm in thickness was laminated on the transfer layer to form such a transfer sheet (sample 1) as shown in FIG. 2.

The above ink components were dispersed together under varying dispersion conditions to prepare various ink compositions, which were then used to make transfer sheets as mentioned above (samples 2 to 5). In particular, sample 4, and sample 5 were prepared using an ink composition that was poorly dispersed by intention.

The surface gloss of the transfer layer (before lamination of the protective film thereon) in each of the thus prepared transfer sheets (samples 1 to 5) was measured, using a gloss meter (VGS-1001DP, Nippon Denshoku Kogyo Co., Ltd.). Also, whether or not air bubbles were trapped between the transfer layer and the protective film laminated thereon was observed. The results are reported in Table 4.

Then, each of the above transfer sheets (samples 1 to 5) was slit to a given width, and rolled around an ABS resin core for storage at 25° C. for 7 days. Thereafter, the protective film was released from each transfer sheet to measure the surface gloss of the transfer layer in the same manner as mentioned above. The results are also reported in Table 4.

After the above storage, the protective film was released from each of the transfer sheets, which was then pressed on a glass substrate (with an electrode pattern already formed thereon) heated to 100° C., using an auto-cutting laminator including a roll heated to 40° C. After each transfer sheet was cooled down to room temperature, the base film was released therefrom to transfer the transfer layer to the glass substrate. At this transfer step, the transferability of each of the transfer sheets (samples 1 to 5) was observed. The results are shown in Table 4.

Finally, the glass substrate was fired at 570° C. to form an dielectric layer.

The thickness, as measured, and surface state, as observed, of each of the thus formed dielectric layers are shown in Table 4.

air bubbles trapped between the transfer layer and the protective film, and be poor in transferability to the glass substrate as well, due to breaks in the transfer layer, poor close contact of the transfer layer with the glass substrate, etc. The dielectric layer formed using this transfer sheet (sample 4), too, is found to have air trapped between the transfer layer and the protective film, and be poor in close contact with the substrate even upon firing. In sample 5, the transfer layer could neither be laminated thereon with the protective film, nor be transferred to the glass substrate.

Reference is then made to the third transfer sheet of the invention. The third transfer sheet is preferable for electrode pattern formation. Fine patterns such as electrode patterns for use with PDPs should currently be formed with ever higher accuracy and at ever lower costs. The third transfer sheet is particularly preferable for forming, with high accuracy, fine patterns such as electrode patterns for use with PDPs.

Referring to FIG. 1, the transfer layer 3 is releasably provided on the base film 2 and comprises, at least, an inorganic component including a glass frit and an organic component removable by firing. This transfer layer 3 should then have a surface gloss between 20 and 110, preferably 30 and 90, and more preferably 60 and 90.

Referring to FIG. 2, the transfer sheet 11 comprises a base film 12, a transfer layer 13 releasably provided on the base film 12, and a protective film 14 releasably provided on the transfer layer 13. The transfer layer 13 comprises, at least, an inorganic component including a glass frit and an organic component removable by firing. Then, the surface gloss of the transfer layer 13 before a protective film 14 is releasably provided thereon, and the surface gloss of the transfer layer 13 after the protective film 14 is released therefrom should be between 40 and 110, preferably 50 and 110, and more preferably 60 and 100.

The transfer sheet 1 or 11 of the invention has an improved surface smoothness because the surface gloss of the transfer layer is in the range of 20 to 110, as mentioned above. In the transfer sheet 11, it is possible to prevent air bubbles from being trapped between the transfer layer 13 and the protective film 14 upon lamination of the protective film 14 thereon. The transfer layer 3 or 13 shows excellent transferability to an application surface so that it can come

TABLE 4

| Transfer Sheet | Surface Gloss | | Air Bubbles | Transferability | Thickness of Dielectric Layer | Surface State of Dielectic Layer |
| --- | --- | --- | --- | --- | --- | --- |
| | before lamination of protective film | after release of protective film | | | | |
| Sample 1 | 87 | 103 | not found | good | 20 μm | good |
| Sample 2 | 63 | 76 | not found | good | 20 μm | good |
| Sample 3 | 23 | 40 | not found | good | 20 μm | good |
| Sample 4 | 15 | 34 | found | poor close contact | 20 μm | matted |
| Sample 5 | 4.8 | not laminated | not laminated | no transfer | — | — |

From Table 4, it is found that each of the second transfer sheets of the invention (samples 1 to 3) has no air bubbles trapped between the transfer layer and the protective film, and shows good transferability to the glass substrate. The dielectric layers formed using these transfer sheets are all found to have uniform thicknesses and satisfactory surface flatness.

On the other hand, the transfer sheet (sample 4) wherein the surface gloss of the transfer layer before lamination of the protective film thereon is less than 20 is found to have in closer contact with the application surface (the transfer layer of the transfer sheet 11 from which the protective film 14 is removed shows excellent transferability to the application surface).

In the present invention, the surface gloss of the transfer layer is represented by a value found using a gloss meter as in the second transfer sheet, and is an index to the surface properties of the transfer layer 3 or 13. When the transfer layer 3 or 13 has surface defects such as agglomerates or pinholes due to poor dispersion of the inorganic component, a drop of the surface smoothness of the transfer layer is reflected on the surface gloss thereof; the surface gloss of the transfer layer becomes lower than 20. When the smoothness of the surface of contact of the transfer layer 13 with the protective film 14 is in bad condition, air is locally trapped between them, resulting in a transfer failure By ensuring that the surface gloss of the transfer layer 3 or 13 is 20 or greater, the transfer layer of the transfer sheet can thus be improved in the surface properties. In other words, the higher the surface gloss of the transfer layer 3 or 13, the more improved the surface properties thereof are. At a surface gloss exceeding 110, however, no further improvements in the surface properties are expected; there are rather production cost increases or production yield reductions. It is consequently preferable that the upper limit to the surface glass is about 110.

On the premise that the third transfer sheet of the invention is used for electrode pattern formation, the structures of the base film, transfer layer, and protective film thereof may be the same as already explained in conjunction with the first transfer sheet of the invention. However, it is to be understood that the surface gloss of the transfer layer 3 or 13 is affected by the powder shape and content of the inorganic component, the type and content of the organic component, the solvent used, the coating conditions applied, etc., and so the transfer layer 3 or 13 should be formed under such conditions as to allow the surface gloss to come within the aforesaid range of 20 to 110.

Then, reference is made to how to form a PDP electrode pattern using the third transfer sheet of the invention.

FIG. 7 is a process sequence of how to form a pattern for the address electrode 74 using the transfer sheet 1 of the invention. It is here to be noted that the transfer layer 3 of the transfer sheet 1 contains a negative photosensitive resin composition as the organic component removable by firing.

Referring here to FIG. 7, the transfer sheet 1 is first pressed on the side of the transfer layer 3 against the back glass substrate 72 comprising a primer layer 73. Then, the transfer layer 3 is transferred to the substrate 72 by release of the base film 2 from the transfer sheet 1 (FIG. 7(A)). At this transfer step, the transfer layer 3 can be well transferred to the substrate 72 because the surface gloss of the transfer layer 3 in the transfer sheet 1 is in the range of 20 to 110, so that the transfer layer 3 can be improved in the surface smoothness of the side of the transfer layer 3 to be transferred and, hence, can be in closer contact with the primer layer 73. When heating is needed for transfer of the transfer layer on the back glass substrate 72, the substrate 72 may be heated independently or using a pressing roll.

Then, the transfer layer 3 is exposed to light using a photomask M (FIG. 7(B)). It is here to be noted that when a light-transmitting film is used for the base film 2, the transfer layer 3 may be exposed to light before release of the base film 2 therefrom.

Subsequently, the transfer layer 3 is developed, thereby forming a pattern 3' comprising a photosensitive resin layer on the primer layer 73 (FIG. 7(C)). Finally, the pattern 3 is fired to remove the organic component therefrom, thereby forming the address electrode pattern 74 (FIG. 7(D)).

In this embodiment of the invention, such a transfer sheet of the invention as shown in FIG. 1 is used. When a transfer sheet having a protective film thereon such as one shown in FIG. 2 is used, the electrode pattern may be formed in the same operation as shown in FIG. 7 after release and removal of the protective film.

Then, the third transfer sheet of the invention is explained more specifically to Example 5.

EXAMPLE 5

A photosensitive resin composition consisting of the following components was prepared for an ink composition.

| Components of the Photosensitive Resin Composition | |
|---|---|
| Silver powders (in a spherical form having an average particle size of 1 μm) | 96 parts by weight |
| Glass frits (of the non-alkali type composed mainly of $Bi_2O_3$, $SiO_2$ and $B_2O_3$ and having a softening point of 500° C.) | 4 parts by weight |
| n-Butyl methacrylate/2-hydroxypropyl methacrylate/ methacrylic acid copolymer (with glycidyl methacrylate added thereto, and having a molecular weight of 80,000 and an acid number of 110 mgKOH/g) | 13 parts by weight |
| Pentaerythritol tri/tetraacrylate | 11 parts by weight |
| Photopolymerization initiator (Irgacure 369, Ciba-Geigy) | 1 part by weight |
| 3-Methoxybutyl acetate | 20 parts by weight |

Then, the above photosensitive resin composition was coated by a blade coating process on a polyethylene terephthalate film (T-60, Toray Industries, Inc.) provided as the base film, and dried at 100° C. for 2 minutes to form a transfer layer of 11 μm in thickness.

Next, a protective film or a silicone-treated polyethylene terephthalate film (SP-PET-03-25-C, Tosero Co., Ltd.) was laminated on the transfer layer to form such a transfer sheet (sample 1) as shown in FIG. 2.

The above photosensitive resin components were dispersed together under varying dispersion conditions to prepare various photosensitive compositions, which were then used to make transfer sheets as mentioned above (samples 2 to 5). In particular, sample 4, and sample 5 were prepared using a photosensitive resin composition that was poorly dispersed by intention.

The surface gloss of the transfer layer (before transfer of the protective film thereon) in each of the thus prepared transfer sheets (samples 1 to 5) was measured, using a gloss meter (VGS-1001DP, Nippon Denshoku Kogyo Co., Ltd.). Also, whether or not air bubbles were trapped between the transfer layer and the protective film laminated thereon was observed. The results are reported in Table 5.

Then, each of the above transfer sheets (samples 1 to 5) was slit to a given width, and rolled around an ABS resin core for storage at 25° C. for 1 day. Thereafter, the protective film was released from each transfer sheet to measure the surface gloss of the transfer layer in the same manner as mentioned above. The results are also reported in Table 5.

After the above storage, the protective film was released from each of the transfer sheets, which was then pressed on a glass substrate heated to 40° C., using an auto-cutting laminator including a roll heated to 40° C. After each transfer sheet was cooled down to room temperature, the base film was released therefrom to transfer the transfer layer to the glass substrate. At this transfer step, the transferability of each of the transfer sheets (samples 1 to 5) was observed. The results are shown in Table 5.

Subsequently, the transfer layer was exposed to ultraviolet radiation of 700 $mJ/cm^2$ (from a light source, i.e., a super high-pressure mercury-vapor lamp) via a negative pattern mask (with an opening line width of 90 μm) for plasma display panel electrodes. Then, the transfer layer was developed with a 0.5% aqueous solution of sodium carbonate to obtain a given pattern. Finally, the glass substrate was fired at 600° C. to form an electrode pattern.

The thicknesses and line widths, as measured, of the thus formed electrode patterns are shown in Table 5.

TABLE 5

| Transfer Sheet | Surface Gloss | | Air Bubbles | Transferability | Thickness of Electrode pattern | Line Width of Electrode Pattern |
|---|---|---|---|---|---|---|
| | before lamination of protective film | after release of protective film | | | | |
| Sample 1 | 87 | 100 | not found | good | 7 ± 1 μm | 65 ± 2 μm |
| Sample 2 | 50 | 80 | not found | good | 7 ± 1 μm | 65 ± 2 μm |
| Sample 3 | 25 | 50 | not found | good | 7 ± 1 μm | 65 ± 2 μm |
| Sample 4 | 15 | 35 | many found | many defects found (*) | — | — |
| Sample 5 | 10 | 25 | many found | no partial transfer | — | — |

(*)shows that many defects occurred upon transfer at the glass substrate temperature of 100° C. and the heating roll temperature of 100° C.

From Table 5, it is found that each of the third transfer sheets of the invention (samples 1 to 3) have no air bubbles trapped between the transfer layer and the protective film, and shows good transferability with respect to the glass substrate. The electrode patterns formed using these transfer sheets are all found to have uniform thicknesses and line widths, and have high accuracy as well.

On the other hand, the transfer sheet (sample 4 or 5) wherein the surface gloss of the transfer layer is less than 20 is found to have air bubbles trapped between the transfer layer and the protective film, and be poor in transferability with respect to the glass substrate as well, due to breaks in the transfer layer, local peeling of the transfer layer, etc. The electrode patterns formed using these transfer sheets are found to be poor in linearity with many defects.

Then, the fourth transfer sheet of the invention is explained. Like the second transfer sheet of the invention, the fourth transfer sheet of the invention is particularly preferable for forming, with high accuracy, primer layers, dielectric layers on front and back plates, photosensitive black matrix layers, and photosensitive rib layers for use with PDPs.

Referring here to FIG. 1, the transfer layer 3 comprises, at least, an inorganic component including a glass frit and an organic component removable by firing, and the peel strength of the transfer layer 3 with respect to the base film 2 should be between 2 g/25 mm and 30 g/25 mm, and preferably 4 g/25 mm and 20 g/25 mm.

Referring to FIG. 2, the transfer layer 13comprises, at least, an inorganic component including a glass frit and an organic component removable by firing. Then, the peel strength of the transfer layer 13 with respect to the base film 12 should be between 2 g/25 mm and 30 g/25 mm, and preferably 4 g/25 mm and 20 g/25 mm while the peel strength of the transfer layer 13 with respect to the protective film 14 should be between 1 g/25 mm and 27 g/25 mm, and preferably 1 g/25 mm and 15 g/25 mm, and be lower than the peel strength of the transfer layer 13 with respect to the base film 12.

When the peel strength of the transfer layer 3 or 13 with respect to the base film 2 or 12 is below 2 g/25 mm, the handleability of the transfer sheet 1 or 11 becomes worse due to the possibility of unnecessary peeling-off or coming-off of the transfer layer 3 or 13. When the peel strength exceeds 30 g/25 mm, a cohesive failure of the transfer layer 3 or 13 is likely to occur upon release of the transfer layer 3 or 13 from the base film 2 or 12. When the transfer layer 3 or 13 is released from the base film 2 or 12 using a machine, large load should be applied on the machine so as to release the transfer layer 3 or 13 from the base film 2 or 12 stably at such high peeling strength.

When the peel strength of the transfer layer 13 with respect to the protective film 14 is below 1 g/25 mm, on the other hand, the handleability of the transfer sheet 11 becomes worse because of the possibility of unnecessary peeling-off or coming-off of the protective film 14. When the peel strength is greater than 27 g/25 mm, a cohesive failure of the transfer layer 13 is likely to occur upon release of the protective film 14 from the transfer layer 13. When the protective film 14 is released from the transfer layer 13 using a machine, it is difficult to provide a stable release of the protective film 14 from the transfer layer 13 due to large tension variations. Preferably, the peel strength of the transfer layer 13 with respect to the protective film 14 should be lower than the peel strength of the transfer layer 13 with respect to the base film 12 by at least 1 g/25 mm.

With the transfer sheet 1 or 11 of the invention, the transfer layer 3 or 13 can be released from the base film 2 or 12 with no cohesive failure of the transfer layer 3 or 13. With the transfer sheet 11 having the protective film 14 placed on the transfer layer 13, the protective film 14 can be released from the transfer layer 13 with no release of the transfer layer 13 from the base film 12, and no cohesive failure of the transfer layer 13.

It is to be noted that the peel strength referred to herein is a value found by peeling off a sample of 25 mm in width through 180° at a speed of 100 mm/min., using a large Tensiron universal testing machine UTM-500, Toyo Baldwin Co., Ltd.

On the premise that the fourth transfer sheet of the invention is used primarily for dielectric layer formation, the structures of the base film, transfer layer, and protective film therein may be the same as explained in conjunction with the first transfer sheet of the invention. The peel strength of the transfer layer 3 or 13 with respect to the base film 2 or 12 can be regulated within the above range of 2 to 30 g/25 mm depending on the content of the inorganic component in the transfer layer 3 or 13, the type and content of the organic component therein, the solvent used, and the coating conditions applied and/or the material and surface state of the base film 2 or 12.

The peel strength of the transfer layer 13 with respect to the protective film 14, too, can be regulated within the above range of 1 g/25 mm to 27 g/25 mm depending on the content of the inorganic component in the transfer layer 13, the type and content of the organic component therein, the solvent used, and the coating conditions applied and/or the material and surface state of the protective film 14.

The protective film 14 that forms one part of the fourth transfer sheet of the invention may be made up of a material that has such surface properties as to allow its peel strength with respect to the transfer layer 13 to be between 1 g/25 mm and 27 g/25 mm, and is flexible and less susceptible to large deformation under tension or pressure.

Reference is made to how to form the dielectric layer 75 in the PDP back panel plate 71 using the fourth transfer sheet of the invention.

FIG. 6 is a process sequence of how to form the dielectric layer 75 using the third transfer sheet of the invention, as in the case of the second transfer sheet of the invention. It is here to be noted that the transfer layer 3 in the transfer sheet 1 contains a negative photosensitive resin composition as the organic component removable by firing.

Referring to FIG. 6, the transfer sheet 1 is pressed on its transfer layer 3 side against the back glass substrate 72 comprising a primer layer 73 and an address electrode pattern 74 formed thereon, after which the base film 2 is released from the transfer sheet 1 for transfer of the transfer layer 3 (FIG. 6(A)). At this transfer step, the transfer layer 3 can be well transferred on the glass substrate with no cohesive failure of the transfer layer 3 because the peel strength between the base film 2 and the transfer layer 3 is in the range of 2 to 30 g/25 mm. It is here to be noted that when heating is needed for transfer of the transfer layer 3, the back glass substrate 72 may be heated independently or using a pressing roll.

Then, the transfer layer 3 is exposed to light via a photomask M (FIG. 6(B)). It is here to be noted that when a light-transmitting film is used as the base film 2, it may be exposed to light before a release of the base film 2 therefrom.

Subsequently, the transfer layer 3 is developed, thereby forming a pattern 3' on the primer layer 73 and address electrode pattern 74 (FIG. 6(C)). Finally, the pattern 3 is fired to remove the organic component therefrom, thereby forming the dielectric layer 75 (FIG. 6(D)).

In the above embodiment, such a transfer sheet of the invention as shown in FIG. 1 is used. However, it is to be understood that when the transfer sheet 11 having the protective film 14 thereon such as one shown in FIG. 2 is used, the dielectric layer may be formed in the same operation as in FIG. 6 after release and removal of the protective film 14.

The protective film 14 can be well released from the transfer layer 13 with no cohesive failure of the transfer layer 13 and with the transfer layer 13 remaining fixed to the base film 12, because the peel strength between the protective film 14 and the transfer layer 13 is in the range of 1 to 27 g/25 mm and is lower than that between the base film 12 and the transfer layer 13.

In this regard, it is to be understood that when the dielectric layer 75 is provided in a full-solid form rather than according to the desired pattern, the organic component can be removed by firing immediately after transfer of the transfer layer.

The present invention is now explained more specifically with reference to Example 6.

EXAMPLE 6

An ink composition A consisting of the following components was prepared.

| Components of the Ink Composition A | |
| --- | --- |
| Glass frits (of the non-alkali type composed mainly of $Bi_2O_3$, ZnO and $B_2O_3$ and having an average particle size of 3 μm) | 70 parts by weight |
| $TiO_2$ | 7 parts by weight |
| $Al_2O_3$ | 5 parts by weight |

It is here to be noted that the above inorganic component mixture had a softening point of 570° C., a glass transition temperature Tg of 485° C. and a coefficient of thermal expansion $_{(\alpha_{300}}$ of $80\times10^{-7}/°$ C.

| | |
| --- | --- |
| n-Butyl methacrylate/2-hydroxyethyl methacrylate copolymer (at a molar ratio of 8/2, and having a molecular weight of 300,000) | 20 parts by weight |
| Adipate type transferability-imparting agent (Adecaizer RS107, Asahi Denka Kogyo Co., Ltd.) | 12 parts by weight |
| Propylene glycol monomethyl ether | 50 parts by weight |

Then, the above ink composition A was coated by a blade coating process on a polyethylene terephthalate film (T-60, Toray Industries, Inc.) provided as the base film, and dried at 100° C. for 2 minutes to form a transfer layer of 17 μm in thickness.

Next, a protective film or a silicone-treated polyethylene terephthalate film (SP-PET-03-25-C, Tosero Co., Ltd.) of 25 μm in thickness was laminated on the transfer layer to form such a transfer sheet (sample 1) as shown in FIG. 2.

An ink composition B consisting of the following components was then prepared to form a transfer sheet (sample 2) in the same manner as mentioned above with the exception that a 30 μm thick polyethylene film (GF-1, Tamapoly Co., Ltd.) was used for the protective film.

| Components of the Ink Composition B | |
| --- | --- |
| Glass frits (of the non-alkali type composed mainly of $Bi_2O_3$, ZnO and $B_2O_3$ and having an average particle size of 3 μm) | 70 parts by weight |
| $TiO_2$ | 7 parts by weight |
| $Al_2O_3$ | 5 parts by weight |

It is here to be noted that the above inorganic component mixture had a softening point of 570° C., a glass transition temperature Tg of 485° C. and a coefficient of thermal expansion $_{(\alpha_{300}}$ of $80\times10^{-7}/°$ C.

| | |
| --- | --- |
| n-Butyl methacrylate/2-hydroxyethyl methacrylate copolymer (at a molar ratio of 8/2, and having a molecular weight of 50,000) | 20 parts by weight |
| Adipate type transferability-imparting agent (Adecaizer RS107, Asahi Denka Kogyo Co., Ltd.) | 12 parts by weight |
| Propylene glycol monomethyl ether | 50 parts by weight |

A transfer sheet (sample 3) was prepared using the above ink composition A and in the same manner as mentioned above, with the exception that a 25 μm thick melamine-treated polyethylene terephthalate film (25SG-1, Panack Co., Ltd.) was used for the base film.

A transfer sheet (sample 4) was also prepared using the above ink composition A and in the same manner as mentioned above, with the exception that a 25 μm thick silicone-treated polyethylene terephthalate film (SP-PET-03-25-C, Tosero Co., Ltd.) was used for the base film and a 25 μm thick silicone-treated polyethylene terephthalate film (SP-PET-03-25-Bu, Tosero Co., Ltd.) was used for the protective film.

Furthermore, an ink composition C consisting of the following components was prepared to form a transfer sheet (sample 5) as in the case of sample 1.

| Components of the Ink Composition C | |
| --- | --- |
| Glass frits (of the non-alkali type composed mainly of $Bi_2O_3$, ZnO and $B_2O_3$ and having an average particle size of 3 μm) | 70 parts by weight |
| $TiO_2$ | 7 parts by weight |
| $Al_2O_3$ | 5 parts by weight |

It is here to be noted that the above inorganic component mixture had a softening point of 570° C., a glass transition temperature Tg of 485° C. and a coefficient of thermal expansion $(\alpha_{300})$ of $80\times10^{-7}/°$ C.

| | |
|---|---|
| n-Butyl methacrylate/2-hydroxyethyl methacrylate copolymer (at a molar ratio of 8/2, and having a molecular weight of 20,000) | 20 parts by weight |
| Adipate type transferability imparting agent (Adecaizer RS107, Asahi Denka Kogyo Co., Ltd.) | 9 parts by weight |
| Propylene glycol monomethyl ether | 50 parts by weight |

Then, each of the above transfer sheets (samples 1 to 5) was slit to a given width, and rolled around an ABS resin core for storage at 25° C. for 7 days. Regarding each of the transfer sheets (samples 1 to 5), the peel strength between the base film and the transfer layer, and the peel strength between the protective film and the transfer layer were measured under the following conditions. The results are reported in Table 6.

Conditions for Measurement of Peel Strength

A sample of 25 mm in width was cut out of each transfer sheet in its flow direction, and then peeled through 180° at a speed of 100 mm/min., using a large Tensiron universal testing machine UTM-500, Toyo Baldwin Co., Ltd. to measure its peel strength.

After the above storage, the protective film was then released from the transfer sheet, which was in turn pressed against a glass substrate heated to 80° C. (with an electrode pattern already formed thereon), using an auto-cutting laminator having a roll heated to 40° C. Following this, the glass substrate was cooled down to room temperature to transfer the transfer layer to the glass substrate after release of the base film therefrom. At this transfer step, the releasability of the protective film from each of the transfer sheets (samples 1 to 5), and the transferability of the transfer layer therefrom (including the transferability of the base film) were observed. The results are reported in Table 6.

Finally, the glass substrate was fired at 570° C. to form a dielectric layer.

The thicknesses and surface states, as measured, of the dielectric layers formed in this manner are also shown in Table 6.

From Table 6, it is found that each of the fourth transfer sheets (samples 1 to 3) of the invention are excellent in the releasability of the protective film from the transfer layer, and in the transferability of the transfer layer to the glass substrate as well. The dielectric layers formed using these transfer sheets, too, are found to have uniform thicknesses and good surface flatness.

The transfer sheet (sample 4) wherein the peel strength between the base film and the base film is less than 2 g/25 mm and the peel strength between the protective film and the transfer layer is less than 1 g/25 mm is unsatisfactory because air is likely to be trapped therein due to poor adhesion between the transfer layer and the base film, and poor adhesion between the transfer layer and the protective layer.

On the other hand, an ordinary releasing machine or laminator can hardly be used with the transfer sheet (sample 5) designed for PDP fabrication, in which the peel strength between the base film and the transfer layer is greater than 30 g/25 mm and the peel strength between the protective film and the transfer layer is greater than 27 g/25 mm, because the force needed to release the protective film, and base film from the transfer layer becomes too large. The surface state of the dielectric layer formed is found to be adversely affected by perceptible peeling traces on the transfer layer upon peeling.

Then, the fifth transfer sheet of the invention is explained. Like the third transfer sheet of the invention, the fifth transfer sheet of the invention is particularly preferable for forming, with high accuracy, primer layers, dielectric layers on front and back plates, photosensitive black matrix layers, and photosensitive rib layers for use with PDPs.

Referring here to FIG. 1, the transfer layer 3 comprises, at least, an inorganic component including a glass frit and an electrically conductive powder, and an organic component removable by firing, and the peel strength of the transfer layer 3 with respect to the base film 2 should be between 0.2 g/25 mm and 30 g/25 mm, preferably 1.0 g/25 mm and 10 g/25 mm, and even more preferably 2.0 g/25 mm and 15 g/25 mm.

Referring to FIG. 2, the transfer layer 13 comprises, at least, an inorganic component inclusive of a glass frit and an electrically conductive powder, and an organic component removable by firing. Then, the peel strength of the transfer layer 13 with respect to the base film 12 should be between 0.2 g/25 mm and 30 g/25 mm, and preferably 1.0 g/25 mm

TABLE 6

| | peel strength (g/25 mm) | | | | | |
|---|---|---|---|---|---|---|
| Transfer Sheet | Base vs. Transfer Layer | Protection vs. Transfer Layer | Releasability* | Transferability | Thickness of Dielectric Layer | Surface State of Dielectric Layer |
| Sample 1 | 10 | 1.5 | good | good | 20 μm | good |
| Sample 2 | 26 | 21 | good | good | 20 μm | good |
| Sample 3 | 3.5 | 1.5 | good | good | 20 μm | good |
| Sample 4 | 1.5 | 0.5 | bad (*1) | bad | 20 μm | air trapped |
| Sample 5 | 48 | 29 | bad | bad (*2) | 20 μm | bad (*3) |

Transferability*: Transferability of the protective film.
(*1): Poor lamination of the protective film was found.
(*2): Poor release of the base film was found.
(*3): Air was trapped between the base film and the transfer layer upon release of the base film and so the close contact of the transfer layer with the substrate became worse. Perceptible traces were found on the transfer layer upon release of the base film and the protective film.

and 10 g/25 mm while the peel strength of the transfer layer 13 with respect to the protective film 14 should be between 0.1 g/25 mm and less than 30 g/25 mm, preferably 0.2 g/25 mm and 10 g/25 mm, and more preferably 0.5 g/25 mm and 8 g/25 mm, and be lower than the peel strength of the transfer layer 13 with respect to the base film 12.

When the peel strength of the transfer layer 3 or 13 with respect to the base film 2 or 12 is below than 0.2 g/25 mm, the handleability of the transfer sheet 1 or 11 becomes worse due to the possibility of unnecessary peeling-off or coming-off of the transfer layer 3 or 13. When the peel strength exceeds 30 g/25 mm, a cohesive failure of the transfer layer 3 or 13 is likely to occur upon release of the transfer layer 3 or 13 from the base film 2 or 12. When the transfer layer 3 or 13 is released from the base film 2 or 12 using a machine, large load should be applied on the machine so as to release the transfer layer 3 or 13 from the base film 2 or 12 stably at such high peeling strength.

When the transfer layer 13 with respect to the protective film 14 is below 0.1 g/25 mm, on the other hand, the handleability of the transfer sheet 11 becomes worse because of the possibility of unnecessary peeling-off or coming-off of the protective film 14. When the peel strength is greater than 30 g/ 25 mm, a cohesive failure of the transfer layer 13 is likely to occur upon release of the protective film 14 from the transfer layer 13. When the protective film 14 is released from the transfer layer 13 using a machine, it is difficult to provide a stable release of the protective film 14 from the transfer layer 13 due to large tension variations. Preferably, the peel strength of the transfer layer 13 with respect to the protective film 14 should be lower than the peel strength of the transfer layer 13 from the base film 12 by at least 1.0 g/25 mm.

With the transfer sheet 1 or 11 of the invention, the transfer layer 3 or 13 can be released from the base film 2 or 12 with no cohesive failure of the transfer layer 3 or 13. With the transfer sheet 11 having the protective film 14 placed on the transfer layer 13, the protective film 14 can be released from the transfer layer 13 with no release of the transfer layer 13 from the base film 12, and no cohesive failure of the transfer layer 13.

It is to be noted that the peel strength referred to herein is a value as measured upon peeling off a sample of 25 mm in width through 180° at a speed of 100 mm/min., using a large universal testing machine of the quartz oscillation digital servo constant-speed distortion type, UTM-500.

On the premise that the fifth transfer sheet of the invention is used primarily for electrode pattern formation, the structures of the base film, transfer layer, and protective film therein may be the same as explained in conjunction with the first transfer sheet of the invention. The peel strength of the transfer layer 3 or 13 with respect to the base film 2 or 12 can be regulated within the above range of 0.2 to 30 g/25 mm depending on the content of the inorganic component in the transfer layer 3 or 13, the type and content of the organic component therein, the solvent used, and the coating conditions applied and/or the material, thickness, surface state, and heat treatment of the base film 2 or 12.

The peel strength of the transfer layer 13 with respect to the protective film 14, too, can be regulated within the above range of 0.1 g/25 mm to less than 30 g/25 mm depending on the content of the inorganic component in the transfer layer 13, the type and content of the organic component therein, the solvent used, and the coating conditions applied and/or the material and surface state of the protective film 14.

In particular, the content of the thermoplastic or photosensitive resin composition in the transfer layer 3 or 13 may be determined in such a way that the peel strength between the base film and the transfer layer is in the range of 0.2 g/25 mm to 30 g/25 mm inclusive and the peel strength between the protective film and the transfer layer is in the range of 0.1 g/25 mm and 30 g/25 mm inclusive, while the type of the resin material used, the material and surface nature of the base film, and the material and surface nature of the protective film to be described later are taken into consideration. For instance, the resin composition may be used in an amount of 3 to 50 parts by weight, and preferably 5 to 40 parts by weight per 100 parts by weight of the above inorganic component. When the content of the thermoplastic or photosensitive resin composition is below 3 parts by weight, the shape retentivity of the transfer layer 3 or 13 becomes low, and a problem arises especially when the transfer sheet is stored and handled in a rolled-up state. In addition, when the transfer sheet 1 or 11 is slit to any desired shape, the inorganic component manifests itself in dust form, which has in turn an adverse influence on the fabrication of plasma display panels. When the content of the thermoplastic or photosensitive resin composition exceeds 50 parts by weight, on the other hand, it is impossible to achieve complete removal of the organic component by firing. Consequently, the quality of the electrode pattern obtained upon firing drops because carbides remain therein.

The protective film 14 that forms the fifth transfer sheet of the invention may be made up of a material that has such surface properties as to allow its peel strength with respect to the transfer layer 13 to be in the range of 0.1 g/25 mm to less than 30 g/25 mm, and is flexible and less susceptible to large deformation under tension or pressure.

Reference is made to how to form a PDP electrode pattern, using the fifth transfer sheet of the invention.

FIG. 7 is a process sequence of how to form a pattern form the address electrode 74 in the PDP back panel plate 71 using the fifth transfer sheet 1 of the invention, as in the case of the third transfer sheet of the invention. It is here to be noted that the transfer layer 3 in the transfer sheet 1 contains a negative photosensitive resin composition as the organic component removable of firing.

Referring to FIG. 7, the transfer sheet 1 is pressed on its transfer layer 3 side against a back glass substrate 72 comprising a primer layer 73 after which the base film 2 is released from the transfer sheet 1 for transfer of the transfer layer 3 (FIG. 7(A)). At this transfer step, the transfer layer 3 can be well transferred on the glass substrate with no cohesive failure of the transfer layer 3 because the peel strength between the base film 2 and the transfer layer 3 is in the range of 1.0 to 10 g/25 mm. It is here to be noted that when heating is needed for transfer of the transfer layer 3, the back glass substrate 72 may be heated independently or using a pressing roll.

Then, the transfer layer 3 is exposed to light via a photomask M (FIG. 7(B)). It is here to be noted that when a light-transmitting film is used as the base film 2, it may be exposed to light before release of the base film 2 therefrom.

Subsequently, the transfer layer 3 is developed, thereby forming a pattern 3' comprising a conductive photosensitive resin layer on the primer layer 73 (FIG. 7(C)). Finally, the pattern 3' is fired to remove the organic component therefrom, thereby forming the address electrode pattern 74 (FIG. 7(D)).

In the above embodiment, such a transfer sheet of the invention as shown in FIG. 1 is used. However, it is to be understood that when the transfer sheet 11 having the protective film 14 thereon such as one shown in FIG. 2 is used, the electrode pattern may be formed in the same operation as in FIG. 7 after release and removal of the protective film 14. The protective film 14 can be well released from the transfer layer 13 with no cohesive failure of the transfer layer 13 and with the transfer layer 13 remaining fixed to the base film 12, because the peel strength between the protective film 14 and the transfer layer 13 is in the range of 0.2 to 10 g/25 mm and is lower than that between the base film 12 and the transfer layer 13.

The fifth transfer sheet of the invention is now explained more specifically with reference to Example 7.

EXAMPLE 7

A photosensitive resin composition A comprising the following components was prepared for an ink composition.

| Composition of the Photosensitive Resin Composition A | |
|---|---|
| Silver powders (in a spherical form having an average particle size of 1 μm) | 96 parts by weight |
| Glass frits (of the non-alkali type composed mainly of $Bi_2O_3$, $SiO_2$ and $B_2O_3$ and having a softening point of 500° C. and a coefficient of thermal expansion $\alpha_{300}$ of $80 \times 10^{-7}/°$ C.) | 4 parts by weight |
| n-Butyl methacrylate/2-hydroxyethyl methacrylate/ methacrylic acid copolymer (with 5 mol % of glycidyl methacrylate added thereto, and having a molecular weight of 70,000 and an acid number of 110 mg KOH/g) | 14 parts by weight |
| Pentaerythritol tri/tetraacrylate (M-305, Toa Synthesis) | 11 parts by weight |
| Photopolymerization initiator (Irgacure 369, Ciba-Geigy) | 1 part by weight |
| 3-Methoxybutyl acetate | 20 parts by weight |

Then, the above photosensitive resin composition was coated by a blade coating process on a polyethylene terephthalate film (T-60, Toray Industries, Inc.) provided as the base film, and dried at 100° C. for 2 minutes to form a transfer layer of 17 μm in thickness.

Next, a protective film or a silicone-treated polyethylene terephthalate film (SP-PET-03-25-C, Tosero Co., Ltd.) of 25 μm in thickness was laminated on the transfer layer to form such a transfer sheet (sample 1) as shown in FIG. 2.

Photosensitive resin compositions B to E consisting of such components as mentioned below were used to make transfer sheets (samples 2 to 5) in the same manner as mentioned above. It is here to be noted that sample 5 (composition E) is the same in composition as sample 2 (composition B) with the exception that a corona-treated PET film (E5101, Toyobo Co., Ltd.) of 25 μm in thickness was used for the base film and an oriented polypropylene film (E-600, Oji Paper Co., Ltd.) of 25 μm in thickness was used for the protective film.

| Composition of the Photosensitive Resin Composition B | |
|---|---|
| Silver powders (in a spherical form having an average particle size of 1 μm) | 96 parts by weight |
| Glass frits (of the non-alkali type composed mainly of $Bi_2O_3$, $SiO_2$ and $B_2O_3$ and having a softening point of 500° C. and a coefficient of thermal expansion $\alpha_{300}$ of $80 \times 10^{-7}/°$ C.) | 4 parts by weight |
| n-Butyl methacrylate/2-hydroxyethyl methacrylate/ methacrylic acid copolymer (having a molecular weight of 70,000 and an acid number of 140 mg KOH/g) | 14 parts by weight |
| Pentaerythritol tri/tetraacrylate (M-305, Toa Gosei) | 12 parts by weight |
| Dibutyl phthalate | 2 parts by weight |
| Photopolymerization initiator (Irgacure 369, Ciba-Geigy) | 1 part by weight |
| 3-Methoxybutyl acetate | 20 parts by weight |
| Composition of the Photosensitive Resin Composition C | |
| Silver powders (in a spherical form having an average particle size of 1 μm) | 96 parts by weight |
| Glass frits (of the non-alkali type composed mainly of $Bi_2O_3$, $SiO_2$ and $B_2O_3$ and having a softening point of 500° C. and a coefficient of thermal expansion $\alpha_{300}$ of $80 \times 10^{-7}/°$ C.) | 4 parts by weight |
| n-Butyl methacrylate/2-hydroxyethyl methacrylate/ methacrylic acid copolymer (having a molecular weight of 70,000 and an acid number of 140 mg KOH/g) | 14 parts by weight |
| Pentaerythritol tri/tetraacrylate (M-305, Toa Gosei) | 8 parts by weight |
| Photopolymerization initiator (Irgacure 369, Ciba-Geigy) | 1 part by weight |
| 3-Methoxybutyl acetate | 20 parts by weight |
| Composition of the Photosensitive Resin Composition D | |
| Silver powders (in a spherical form having an average particle size of 1 μm) | 96 parts by weight |
| Glass frits (of the non-alkali type composed mainly of $Bi_2O_3$, $SiO_2$ and $B_2O_3$ and having a softening point of 500° C. and a coefficient of thermal expansion $\alpha_{300}$ of $80 \times 10^{-7}/°$ C.) | 4 parts by weight |
| n-Butyl methacrylate/2-hydroxyethyl methacrylate/ methacrylic acid copolymer (having a molecular weight of 70,000 and an acid number of 140 mg KOH/g) | 14 parts by weight |
| Pentaerythritol tri/tetraacrylate (M-305, Toa Gosei) | 8 parts by weight |
| Photopolymerization initiator (Irgacure 369, Ciba-Geigy) | 1 part by weight |
| N-methyl-2-pyrrolidone | 20 parts by weight |
| Composition of the Photosensitive Resin Composition E | |
| Silver powders (in a spherical form having an average particle size of 1 μm) | 96 parts by weight |
| Glass frits (of the non-alkali type composed mainly of $Bi_2O_3$, $SiO_2$ and $B_2O_3$ and having a softening point of 500° C. and a coefficient of thermal expansion $\alpha_{300}$ of $80 \times 10^{-7}/°$ C.) | 4 parts by weight |
| n-Butyl methacrylate/2-hydroxyethyl methacrylate/ methacrylic acid copolymer (having a molecular weight of 70,000 and an acid number of 140 mg KOH/g) | 14 parts by weight |
| Pentaerythritol tri/tetraacrylate (M-305, Toa Gosei) | 14 parts by weight |
| Photopolymerization initiator (Irgacure 369, Ciba-Geigy) | 1 part by weight |
| 3-Methoxybutyl acetate | 20 parts by weight |

Then, each of the above transfer sheets (samples 1 to 5) was slit to a given width, and rolled around an ABS resin core for storage at 25° C. for 7 days. Regarding each of the transfer sheets (samples 1 to 5), the peel strength between the base film and the transfer layer, and the peel strength between the protective film and the transfer layer were measured under the following conditions. The results are reported in Table 7.

Conditions for Measurement of Peel Strength

A sample of 25 mm in width was cut out of each transfer sheet in its flow direction, and then peeled through 180° at a speed of 100 mm/min., using a large Tensiron universal testing machine UTM-500, Oritentic Co., Ltd. to measure its peeling strength.

After the above storage, the protective film was then released from the transfer sheet, which was in turn pressed against a glass substrate at room temperature, using an auto-cutting laminator having a roll heated to 40° C. Following this, the glass substrate was cooled down to room temperature to transfer the transfer layer on the glass substrate after release of the base film therefrom. At this transfer step, the releasability of the protective film from each of the transfer sheets (samples 1 to 5), and the transferability of the transfer layer therefrom (including the transferability of the base film) were observed. The results are reported in Table 7.

Then, the transfer layer was exposed to ultraviolet radiation of 800 mJ/cm$^2$ (from a light source, i.e., a super high-pressure mercury-vapor lamp) via a negative pattern mask (with an opening line width of 70 μm) for plasma display panel electrodes. Following this, the transfer layer was developed with a 0.5% aqueous solution of sodium carbonate, washed with pure water, and dried to obtain a given pattern. Then, the glass substrate was fired at 600° C. to form an electrode pattern.

The thicknesses and line widths, as measured, of the thus formed electrode patterns are shown in Table 7.

sixth transfer sheet of the invention is a transfer sheet capable of forming, with high accuracy, fine patterns such as electrodes, resistors inclusive of dielectric layers, and barriers for use with image display equipment inclusive of PDPs and liquid crystal display devices, thermal heads, and integrated circuits.

Referring to FIG. 1, the transfer layer 3 is releasably provided on the base film 2. This transfer layer 3 comprises, at least, an inorganic component including a glass frit and an organic component removable by firing, and has a residual solvent content of at most 100 mg/m$^2$, preferably at most 50 mg/m$^2$, and more preferably at most 30 mg/m$^2$.

Referring to FIG. 2, the transfer sheet 11 comprises a base film 12, a transfer layer 13 releasably provided on the base film 12, and a protective film 14 releasably provided on the transfer layer 13. This transfer layer 3 comprises, at least, an inorganic component including a glass frit and an organic component removable by firing, and has a residual solvent content of at most 100 mg/m$^2$, preferably at most 50 mg/m$^2$, and more preferably at most 30 mg/m$^2$.

In the present invention, it is not preferable that the transfer layer 3 or 13 has a residual solvent content of greater

TABLE 7

| | Peel Strength (g/25 mm) | | | | | |
|---|---|---|---|---|---|---|
| Transfer Sheet | Base vs. Transfer Layer | Protection vs. Transfer Layer | Releasability Protective Film | Transferability | Thickness of Electrode Pattern | Line Width of Electrode Pattern |
| Sample 1 | 3.0 | 1.0 | good | good | 17 ± 1 (7 ± 1) μm* | 71 ± 3 (60 ± 3) μm* |
| Sample 2 | 5.0 | 2.5 | good | good | 17 ± 1 (7 ± 1) μm* | 71 ± 3 (60 ± 3) μm* |
| Sample 3 | 2.0 | 0.5 | good | good | 17 ± 1 (7 ± 1) μm* | 71 ± 3 (60 ± 3) μm* |
| Sample 4 | ≦0.2 | ≦0.1 | (1) | (2) | many breaks found | |
| Sample 5 | 36 | 32 | (3) | (4) | many breaks found | |

*: The thickness of the electrode pattern was measured after development. The bracketed value was obtained upon firing.
(1): Delamination was likely to occur due to the trapping of air.
(2): The adhesive force between the transfer layer and the glass substrate was weak.
(3): Perceptible traces remained.
(4): A cohesive failure of the transfer layer occurred upon release of the base film.

From Table 7, it is found that each of the fifth transfer sheets (samples 1 to 3) of the invention is improved in terms of the releasability of the protective film from the transfer layer, and the transferability of the transfer layer to the glass substrate as well. It is also found that the patterns obtained using these transfer sheets have uniform thicknesses and line widths, and are formed with high accuracy.

In one comparative transfer sheet (sample 4) wherein the peel strength between the base film and the transfer layer is below 0.2 g/25 mm and the peel strength between the protective film and the transfer layer is below 0.1 g/25 mm, on the other hand, air and foreign matter are trapped between the protective film and the transfer layer upon slitting. It is also found that the transfer layer is susceptible to peeling or cracking because the adhesive force between the base film and the transfer layer is weak. In the electrode pattern formed using this transfer sheet, therefore, many breaks are found.

In another comparative transfer sheet (sample 5) wherein the peel strength between the base film and the transfer layer is greater than 30 g/25 mm and the peel strength between the protective film and the transfer layer is greater than 30 g/25 mm, the transfer layer is injured or dented upon release of the protective film therefrom, and undergoes a local cohesive failure upon release of the base film therefrom. In the electrode pattern formed using this transfer sheet, therefore, many breaks are found.

Reference is now made to the sixth transfer sheet of the invention. Like the first transfer sheet of the invention, the than 100 mg/m$^2$, because the transfer layer 3 or 13 is susceptible to a cohesive failure upon release of the base film 2 or 12, or the protective film 14 therefrom. This is also not preferable because the adhesive force between the transfer layer 3 or 13 and the base film 2 or 12 or the protective film 14 becomes too high, resulting in a releasability drop and a lowering of the storage stability of the transfer sheet 1 or 11, and because when a photosensitive resin composition is used as the organic component removable by firing, patterning accuracy drops upon exposure, and development.

The structures of the base film, transfer layer, and protective film in the sixth transfer sheet of the invention may be the same as explained in conjunction with the first transfer sheet of the invention.

Reference is then made to how to form a PDP electrode pattern and a dielectric layer using the sixth transfer sheet of the invention.

FIG. 7 is a process sequence of how to form a pattern form the address electrode 74 in the PDP back panel plate 71, using the sixth transfer sheet of the invention. It is here to be noted that the transfer layer 3 in the transfer sheet 1 contains a negative photosensitive resin composition as the organic component removable by firing.

Referring to FIG. 7, the transfer sheet 1 is pressed on its transfer layer 3 side against a back glass substrate 72 provided with a primer layer 73, after which the base film 2 is released from the transfer sheet 1 for transfer of the transfer layer 3 (FIG. 7(A)). It is here to be noted that when heating is needed for transfer of the transfer layer 3, the back glass substrate 72 may be heated independently or using a pressing roll.

Then, the transfer layer 3 is exposed to light via a photomask M (FIG. 7(B)). It is here to be noted that when a light-transmitting film is used as the base film 2, it may be exposed to light before release of the base film 2 therefrom.

Subsequently, the transfer layer 3 is developed, thereby forming a pattern 3' comprising a conductive photosensitive resin layer on the primer layer 73 (FIG. 7(C)). Finally, the pattern 3' is fired to remove the organic component therefrom, thereby forming the address electrode pattern 74 (FIG. 7(D)).

In the above embodiment, such a transfer sheet of the invention as shown in FIG. 1 is used. However, it is to be understood that when the transfer sheet having the protective film thereon such as one shown in FIG. 2 is used, the pattern may be formed in the same operation as in FIG. 7 after release and removal of the protective film 14. In this regard, it is to be understood that when the dielectric layer 75 is provided in a full-solid form, the organic component can be removed by firing immediately after transfer of the transfer layer.

The sixth transfer sheet of the invention is now explained more specifically with reference to Examples 8, and 9.

EXAMPLE 8

A conductive photosensitive resin composition consisting of the following components was prepared as an ink composition.

| Components of the Photosensitive Resin Composition | |
| --- | --- |
| Silver powders (in a spherical form having an average particle size of 1 $\mu$m) | 96 parts by weight |
| Glass frits (of the non-alkali type composed mainly of $Bi_2O_3$, $SiO_2$ and $B_2O_3$ and having a softening point of 500° C. and a coefficient of thermal expansion $\alpha_{300}$ of $80 \times 10^{-7}/°$ C.) | 4 parts by weight |
| n-Butyl methacrylate/2-hydroxyethyl methacrylate/ methacrylic acid copolymer (having a molecular weight of 70,000 and an acid number of 140 mg KOH/g) | 13 parts by weight |
| Ethylene oxide-modified trimethylolpropane triacrylate (M-350, Toa synthesis) | 11 parts by weight |
| Photopolymerization initiator (Irgacure 369, Ciba-Geigy) | 1 part by weight |
| 3-Methoxybutyl acetate | 20 parts by weight |

Then, the above ink composition was coated by a blade coating process on a 50 $\mu$m thick polyethylene terephthalate film (T-60, Toray Industries, Inc.) provided as the base film, and dried at 100° C. for 2 minutes to form a transfer layer of 17 $\mu$m in thickness. The transfer layer had a residual solvent content of 30 mg/m$^2$.

Next, a protective film or a polyethylene film (GF-3, Tamapoly Co., Ltd.) of 90 $\mu$m in thickness was laminated on the transfer layer to form such a transfer sheet (sample 1) as shown in FIG. 2.

Transfer sheets (samples 2 to 6) were prepared as in the same manner as in sample 1 with the exception that the drying conditions were varied to regulate the residual solvent content of the transfer layer to 5 mg/M$^2$, 50 mg/m$^2$, 100 mg/m$^2$, 150 mg/m$^2$, and 300 mg/M$^2$.

Then, each of the above transfer sheets (samples 1 to 6) was slit to a given width, and rolled around an ABS resin core for storage at 25° C. for 7 days. Thereafter, the protective film was released from the transfer sheet, which was in turn pressed against a glass substrate heated to 80° C., using an auto-cutting laminator having a roll heated to 40° C. Following this, the glass substrate was cooled down to room temperature to transfer the transfer layer to the glass substrate after release of the base film therefrom.

Then, the transfer layer was exposed to ultraviolet radiation of 700 mJ/cm$^2$ (from a light source, i.e., a super high-pressure mercury-vapor lamp) via a negative pattern mask (with an opening line width of 70 $\mu$m) for plasma display panel electrodes. Following this, the transfer layer was developed with a 0.5% aqueous solution of sodium carbonate to obtain a given pattern. Finally, the glass substrate was fired at 600° C. to form an electrode pattern.

The thicknesses and line widths, as measured, of the thus formed electrode patterns are shown in Table 8.

TABLE 8

| Transfer Sheet | Residual Solvent Content (mg/m$^2$) | Thickness of Electrode Pattern ($\mu$m) | Line Width of Electrode Pattern ($\mu$m) |
| --- | --- | --- | --- |
| Sample 1 | 30 | 6 ± 1 | 60 ± 3 |
| Sample 2 | 5 | 6 ± 1 | 60 ± 3 |
| Sample 3 | 50 | 6 ± 1 | 60 ± 3 |
| Sample 4 | 100 | 6 ± 1 | 60 ± 3 |
| Sample 5 | 150 | 4 to 9 *1 | 60 ± 8 *1 |
| Sample 6 | 300 | — *2 | — *2 |

*1 A part of the pattern flowed.
*2 A cohesive failure of the transfer layer occurred during release of the protective film therefrom.

From Table 8, it is found that the electrode patterns obtained using the transfer sheets (samples 1 to 4) of the invention have uniform thicknesses and line widths and are formed with high accuracy. It is also found that the transfer sheets have high storage stability.

In each of the transfer sheets (samples 5, and 6) having an increased residual solvent content, it is found that the pattern flows, resulting in the occurrence of many chips and breaks. It is also found that these transfer sheets have poor storage stability due to the seeping of the transfer layers from their sides, the cracking of the transfer layers, the peeling-off of the protective films, and the cohesive failures of the transfer layers upon release of the base film, etc.

EXAMPLE 9

An ink composition consisting of the following components was prepared for dielectric formation.

| Component of the Ink Composition | |
| --- | --- |
| Glass frits (of the non-alkali type composed mainly of $Bi_2O_3$, $SiO_2$ and $B_2O_3$ and having an average particle size of 3 $\mu$m) | 70 parts by weight |
| TiO2 | 7 parts by weight |
| $Al_2O_3$ | 5 parts by weight |

It is here to be noted that the above inorganic component mixture had a softening point of 570° C., a glass transition temperature Tg of 485° C. and a coefficient of thermal expansion a300 of $80 \times 10^{-7}/°$ C.

| | |
|---|---|
| n-Butyl methacrylate/2-hydroxyethyl methacrylate/ methacrylic acid copolymer (at a molar ratio of 8/2 and having a molecular weight of 300,000) | 20 parts by weight |
| Adipate type transferability-imparting agent (Adecaizer RS107, Asahi Denka Kogyo Co., Ltd.) | 12 parts by weight |
| Propylene glycol monomethyl ether | 50 parts by weight |

Then, the above ink composition was coated by a blade coating process on a 25 μm thick polyethylene terephthalate film (T-60, Toray Industries, Inc.) provided as the base film, and dried at 100° C. for 2 minutes to form a transfer layer of 25 μm in thickness. The transfer layer had a residual solvent content of 20 mg/m².

Next, a protective film or a silicone-treated polyethylene film (SP-PET-03-25-C, Tosero Co., Ltd.) of 25 μm in thickness was laminated on the transfer layer to form such a transfer sheet (sample 1) as shown in FIG. 2.

Transfer sheets (samples 2 to 4) were prepared as in the same manner as in sample 1 with the exception that the drying conditions were varied to regulate the residual solvent content of the transfer layer to 40 mg/m², 80 mg/m², and 150 mg/m².

Then, each of the above transfer sheets (samples 1 to 4) was slit to a given width, and rolled around an ABS resin core for storage at 25° C. for 7 days. Thereafter, the protective film was then released from the transfer sheet, which was in turn pressed against a glass substrate (with an electrode pattern already formed thereon) heated to 100° C., using an auto-cutting laminator having a roll heated to 100° C. Following this, the glass substrate was cooled down to room temperature to transfer the transfer layer to the glass substrate after release of the base film therefrom.

Finally, the glass substrate was fired at 570° C. to form a dielectric layer.

The thicknesses and line widths, as measured, of the thus formed dielectric layers are shown in Table 9.

TABLE 9

| Transfer Sheet | Residual Solvent Content (mg/m²) | Thickness of Dielectric Layer (μm) | Sur. States of Dielectric Layer |
|---|---|---|---|
| Sample 1 | 20 | 10 ± 1 | good |
| Sample 2 | 40 | 10 ± 1 | good |
| Sample 3 | 80 | 10 ± 1 | good |
| Sample 4 | 150 | 7 to 13 | pinholes found |

From Table 9, it is found that the dielectric layers obtained using the transfer sheets (samples 1 to 3) of the invention have uniform thicknesses, and satisfactory surface flatness as well. It is also found that the transfer sheets have high storage stability.

On the other hand, the dielectric layer obtained using the transfer sheet (sample 4) having an increased residual solvent content is found to have many pinholes, and an unsatisfactory thickness distribution as well. Also, the storage stability of this transfer sheet is unsatisfactory due to the seeping of the transfer layer from its side, the cohesive failure of the transfer layer upon release of the base film.

What we claim is:

1. A transfer method, characterized by using a transfer sheet comprising, at least, a base film and a transfer layer detachably provided on said base film, said transfer layer containing at least an inorganic component including a glass frit and an organic component removable by firing and having a surface gloss in the range of 20 to 110 as measured on said transfer layer, wherein said transfer layer is transferred on a substrate, and then said transfer layer is patterned.

2. The transfer method according to claim 1, characterized in that a protective film is detachably provided on said transfer layer, and said protective film has a surface gloss in the range of 30 to 110 upon release of said protective film.

3. The transfer method according to claim 1 or 2, characterized in that said organic component has photosensitivity.

4. A transfer method, characterized by using a transfer sheet comprising a base film and a transfer layer detachably provided on said base film, said transfer layer containing at least an inorganic component including a glass frit and an electrically conductive powder and an organic component removable by firing and having a surface gloss in the range of 20 to 110 as measured on said transfer layer, wherein said transfer layer is transferred on a substrate, and then said transfer layer is patterned.

5. The transfer method according to claim 4, characterized in that a protective film is detachably provided on said transfer layer, and said protective film has a surface gloss in the range of 40 to 110 upon release of said protective film.

6. The transfer method according to claim 4 or 5, characterized in that said organic component has photosensitivity.

* * * * *